(12) United States Patent
Heo et al.

(10) Patent No.: US 11,890,639 B2
(45) Date of Patent: Feb. 6, 2024

(54) APPARATUS FOR TREATING SUBSTRATE

(71) Applicant: SEMES CO., LTD., Chungcheongnam-do (KR)

(72) Inventors: Chan Young Heo, Gyeonggi-do (KR); Kihoon Choi, Chungcheongnam-do (KR); Ki-Moon Kang, Gyeonggi-do (KR); Do Heon Kim, Gyeonggi-do (KR); Jaeseong Lee, Gyeonggi-do (KR)

(73) Assignee: SEMES CO., LTD., Cheonan-si (KR)

( * ) Notice: Subject to any disclaimer, the term of this patent is extended or adjusted under 35 U.S.C. 154(b) by 345 days.

(21) Appl. No.: 16/936,132

(22) Filed: Jul. 22, 2020

(65) Prior Publication Data
US 2021/0023582 A1 Jan. 28, 2021

(30) Foreign Application Priority Data

Jul. 22, 2019 (KR) .................. 10-2019-0088317

(51) Int. Cl.
*B05C 5/02* (2006.01)
*B05C 11/10* (2006.01)

(52) U.S. Cl.
CPC .......... *B05C 5/0208* (2013.01); *B05C 5/0225* (2013.01); *B05C 11/1002* (2013.01); *B05C 11/1042* (2013.01)

(58) Field of Classification Search
None
See application file for complete search history.

(56) References Cited

U.S. PATENT DOCUMENTS

| | | | | |
|---|---|---|---|---|
| 8,434,423 | B2* | 5/2013 | Toshima | H01L 21/67034 118/421 |
| 9,275,847 | B2* | 3/2016 | Jung | H01L 21/67028 |
| 9,679,788 | B2* | 6/2017 | Jung | H01L 21/67034 |
| 10,083,840 | B2* | 9/2018 | Lee | B01D 11/0492 |
| 10,770,272 | B2* | 9/2020 | Hawrylchak | H01J 37/32449 |
| 10,908,503 | B2* | 2/2021 | Choi | G03F 7/3057 |
| 10,915,026 | B2* | 2/2021 | Choi | H01L 21/67742 |
| 10,984,990 | B2* | 4/2021 | Bokka | H01J 37/32724 |
| 11,001,928 | B2* | 5/2021 | Utsumi | C23C 18/1628 |
| 11,004,675 | B2* | 5/2021 | Choi | H01L 21/6719 |
| 11,094,509 | B2* | 8/2021 | Satake | H01J 37/32651 |
| 11,148,150 | B2* | 10/2021 | Choi | B05B 1/044 |
| 11,201,035 | B2* | 12/2021 | Lane | H01J 37/3244 |

(Continued)

FOREIGN PATENT DOCUMENTS

| | | |
|---|---|---|
| KR | 10-2016-0135035 A | 11/2016 |
| KR | 10-2018-0116803 A | 10/2018 |

(Continued)

*Primary Examiner* — Jethro M. Pence
(74) *Attorney, Agent, or Firm* — Procopio, Cory, Hargreaves & Savitch LLP

(57) ABSTRACT

An apparatus for treating a substrate includes a process chamber having a treatment space defined therein, a support unit for supporting the substrate in the treatment space, a fluid supply unit for supplying supercritical fluid to the treatment space, and a controller configured to control the fluid supply unit, wherein the fluid supply unit is configured to selectively supply the supercritical fluid at a first density or a second density higher than the first density into the treatment space. Thus, drying efficiency of the substrate when drying the substrate using the supercritical fluid may be improved.

13 Claims, 17 Drawing Sheets

(56) References Cited

U.S. PATENT DOCUMENTS

| | | | |
|---|---|---|---|
| 11,213,849 B2* | 1/2022 | Choi | B05C 9/14 |
| 11,348,769 B2* | 5/2022 | Hawrylchak | H01J 37/32834 |
| 2007/0215572 A1* | 9/2007 | Saito | C23C 8/42 |
| | | | 257/E29.295 |
| 2011/0091641 A1* | 4/2011 | Blankenborg | D21H 25/18 |
| | | | 118/712 |
| 2014/0290092 A1* | 10/2014 | Jung | B01D 53/04 |
| | | | 34/570 |
| 2019/0333788 A1* | 10/2019 | Lee | H01L 21/6719 |
| 2020/0026194 A1* | 1/2020 | Choi | G03F 7/325 |
| 2021/0020430 A1* | 1/2021 | Kim | B08B 7/0021 |

FOREIGN PATENT DOCUMENTS

| | | | | |
|---|---|---|---|---|
| KR | 10-2018-0136863 A | | 12/2018 | |
| KR | 10-2019-0000529 A | | 1/2019 | |
| KR | 20190000529 A | * | 1/2019 | ............ H01L 21/01 |
| KR | 10-2019-0041158 A | | 4/2019 | |

* cited by examiner

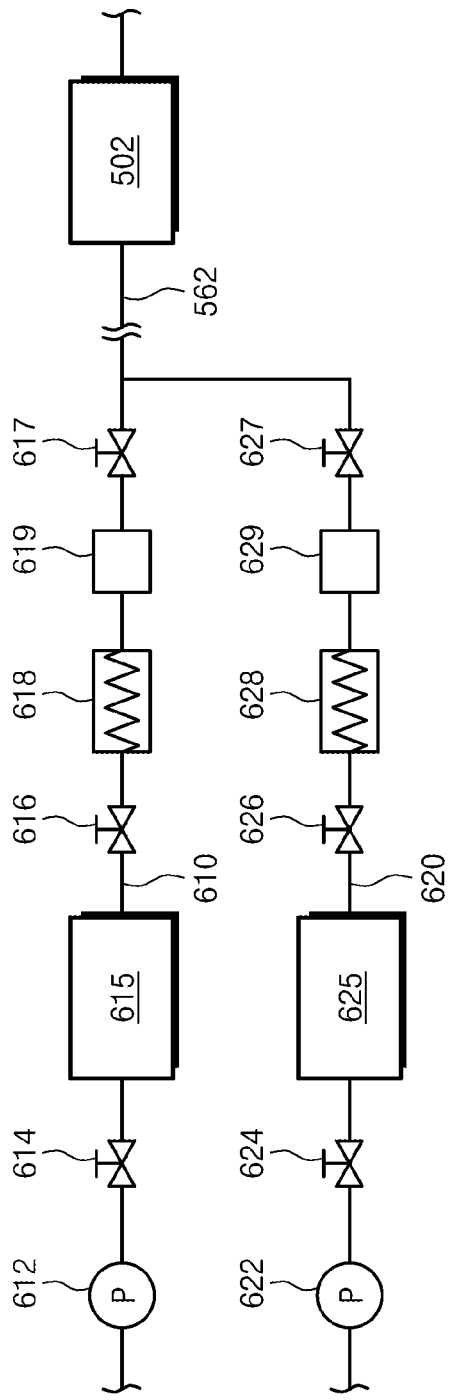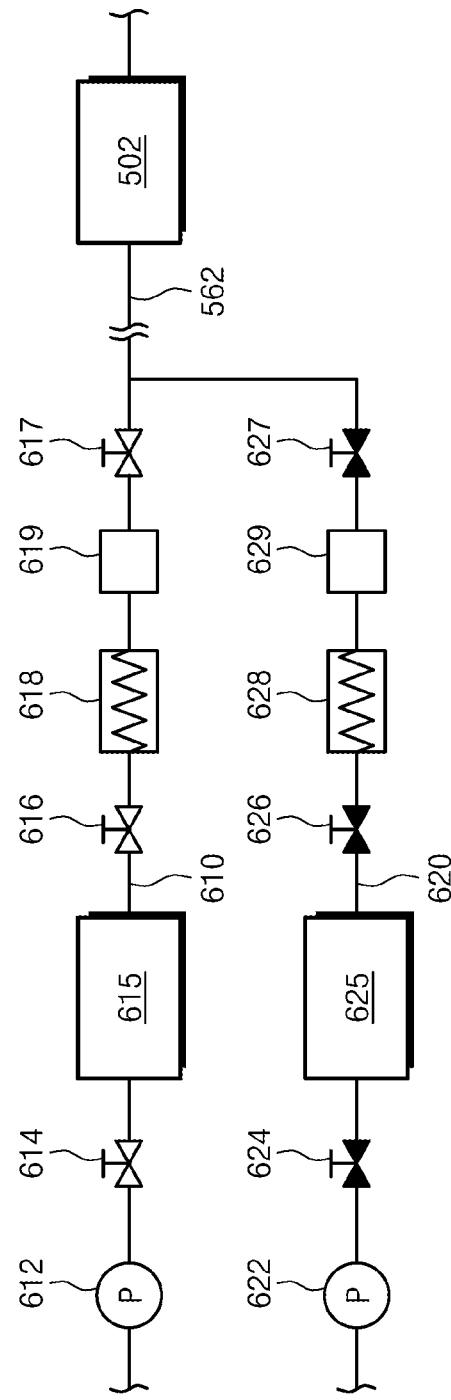

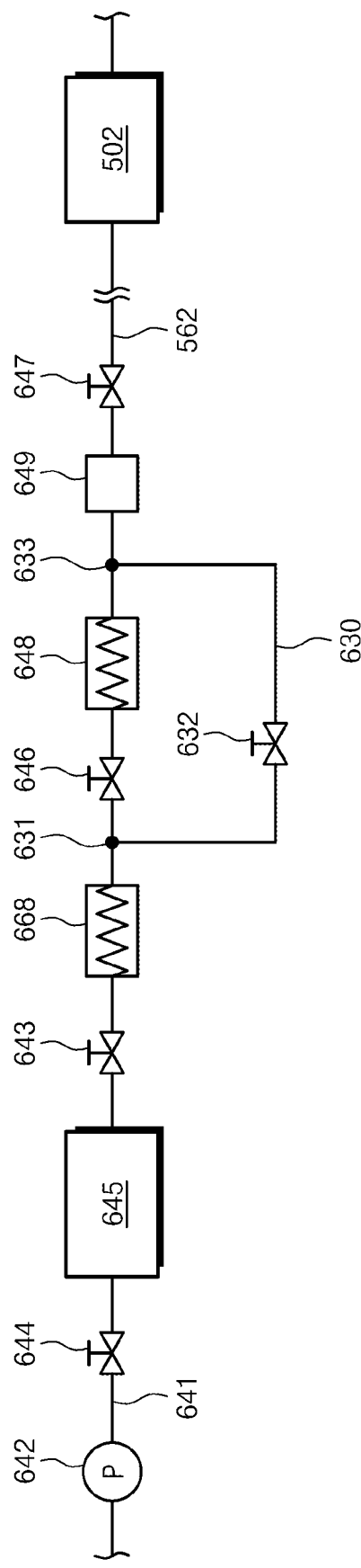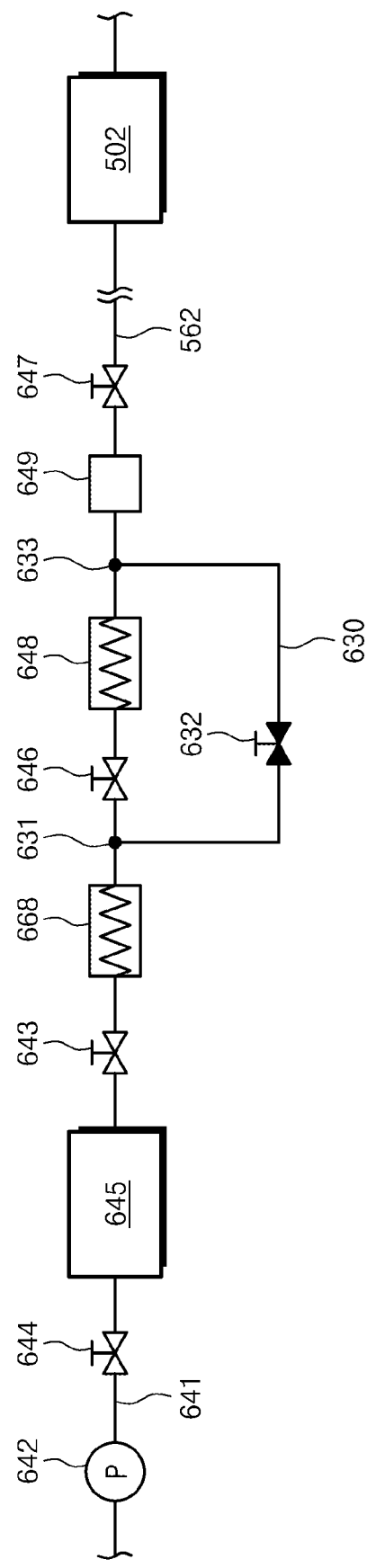

APPARATUS FOR TREATING SUBSTRATE

CROSS-REFERENCE TO RELATED APPLICATIONS

A claim for priority under 35 U.S.C. § 119 is made to Korean Patent Application No. 10-2019-0088317 filed on Jul. 22, 2019, in the Korean Intellectual Property Office, the entire contents of which are hereby incorporated by reference.

BACKGROUND

Embodiments of the inventive concept described herein relate to an apparatus for treating a substrate, and more particularly, to an apparatus for treating a substrate using supercritical fluid.

In general, a semiconductor device is manufactured from a substrate, such as a wafer. Specifically, the semiconductor device is manufactured by performing a deposition process, a photolithography process, an etching process, or the like to form a fine circuit pattern on a top surface of the substrate.

As the top surface of the substrate on which the circuit pattern is formed may be contaminated with various foreign substances while performing the above processes, a cleaning process may be performed to remove the foreign substances.

In general, a cleaning process includes a chemical treating step of supplying chemical to the substrate to remove foreign substances on the substrate, a rinsing step of supplying distilled water to the substrate to remove the chemical remaining on the substrate, and a drying step to remove the distilled water remaining on the substrate.

Supercritical fluid is used for the drying of the substrate. In one example, after replacing the distilled water on the substrate with an organic solvent, the supercritical fluid is supplied to a top surface of the substrate in a high pressure chamber, such that the organic solvent remaining on the substrate is dissolved in the supercritical fluid to remove the organic solvent from the substrate. Isopropyl alcohol (IPA) is used as the organic solvent, carbon dioxide ($CO_2$) in which IPA is well soluble and whose a critical temperature and a critical pressure are relatively low as the supercritical fluid.

Treatment of the substrate using the supercritical fluid is as follows. When the substrate is brought into a high pressure chamber, carbon dioxide in the supercritical state is supplied into the high pressure chamber to pressurize an inside of the high pressure chamber. Then, while the supply of the supercritical fluid and exhausting of the high pressure chamber are repeated, the substrate is treated with the supercritical fluid. When the treatment of the substrate is completed, the inside of the high pressure chamber is exhausted and thus the pressure is reduced.

In a conventional process of drying the substrate using the supercritical fluid, the supercritical fluid at a low density and at a high temperature of 100° C. or higher is supplied such that the IPA on the substrate is dried using the supercritical fluid. In this connection, the supercritical fluid at the low density moves in one direction from a top to a bottom in a chamber in which a supercritical process is performed. Thus, IPA which is not dissolved in the supercritical fluid which moves from the top to the bottom and exits the chamber remains on and adsorbs into the substrate, thereby causing a pattern lining or particles. Accordingly, a process time is increased to reduce the IPA remaining on the substrate. However, this may cause a semiconductor price to increase and a semiconductor yield to decrease.

SUMMARY

Embodiments of the inventive concept provide a substrate treating apparatus that may improve treatment efficiency of the substrate when treating the substrate using the supercritical fluid.

Embodiments of the inventive concept provide an apparatus for treating the substrate that selectively supplies supercritical fluids having different densities when drying the substrate using the supercritical fluids.

A purpose of the inventive concept is not limited thereto. Other purposes as not mentioned will become apparent to those skilled in the art from following descriptions.

According to an exemplary embodiment, an apparatus for treating a substrate includes a process chamber having a treatment space defined therein, a support unit for supporting the substrate in the treatment space, a fluid supply unit for supplying supercritical fluid to the treatment space, and a controller that controls the fluid supply unit, wherein the fluid supply unit is configured to selectively supply the supercritical fluid at a first density or a second density above the first density into the treatment space.

The apparatus may include a first supply line at which a first reservoir may be installed, wherein the supercritical fluid at the first density may be stored in the first reservoir, and a second supply line at which a second reservoir may be installed, wherein the supercritical fluid at the second density may be stored in the second reservoir.

The first reservoir and the second reservoir may have different temperatures.

The first reservoir and the second reservoir may have different pressures.

The apparatus may include a first heater disposed at the first supply line to heat the supercritical fluid, and a second heater disposed at the second supply line to heat the supercritical fluid.

The first and second heaters may have different outputs.

The controller may control the first and second heaters to heat the supercritical fluid at the first density and the supercritical fluid at the second density to have different temperatures, respectively.

The apparatus may include a reservoir for containing the supercritical fluid, a supply line for supplying the supercritical fluid contained in the reservoir to the treatment space, a first heater installed at the supply line and located downstream of the reservoir, a bypass line connected to the supply line and configured to bypass the first heater, and an adjustment member that allows the supercritical fluid to flow in a selected direction among a direction toward the bypass line and a direction toward the first heater.

The apparatus may further include a second heater installed at the supply line and disposed between the bypass line and the reservoir, or between the bypass line and the treatment space.

When the supercritical fluid flows through the first heater, the supercritical fluid at the first density may be supplied to the treatment space. When the supercritical fluid flows through the bypass line, the supercritical fluid at the second density may be supplied to the treatment space.

When the supercritical fluid flows through the first heater and the second heater, the supercritical fluid at the first density may be supplied to the treatment space. When the supercritical fluid flows through the second heater and the bypass line, the supercritical fluid at the second density may be supplied to the treatment space.

The controller may control the fluid supply unit to sequentially perform a pressurizing step of supplying the supercritical fluid to the treatment space to pressurize the treatment space after the substrate may be brought into the treatment space, a treating step of supplying the supercritical fluid to the treatment space to treat the substrate with the supercritical fluid, and a decompressing step of discharging the supercritical fluid out of the treatment space after the substrate treatment may be completed.

The controller may control the fluid supply unit such that the pressurizing step includes a first pressurization step of supplying the supercritical fluid at the second density to the treatment space to pressurize the treatment space to a preset pressure, and a second pressurization step of supplying the supercritical fluid at the first density to the treatment space to pressurize the treatment space to a target pressure.

The controller may control the fluid supply unit such that the decompressing step may be performed such that the supercritical fluid may be supplied to the treatment space during the discharging of the supercritical fluid out of the treatment space, and a temperature of the supercritical fluid supplied to the treatment space in the decompressing step may be higher than a temperature of the supercritical fluid supplied to the treatment space in the pressurizing step.

The controller may control the fluid supply unit such that the decompressing step may be performed such that a supply amount per unit time of the supercritical fluid supplied to the treatment space may be smaller than a discharged amount per unit time of the supercritical fluid out of the treatment space.

The controller may control the fluid supply unit such that a supply amount per unit time of the supercritical fluid supplied to the treatment space in the decompressing step may be smaller than a supply amount per unit time of the supercritical fluid supplied to the treatment space in the pressurizing step.

The controller may control the fluid supply unit such that the decompressing step includes a first decompressing step of supplying the supercritical fluid at the first density to the treatment space while discharging the supercritical fluid out of the treatment space, and a second decompressing step of discharging the supercritical fluid out of the treatment space without supplying the supercritical fluid to the treatment space after the first decompressing step.

The apparatus may include the support unit for supporting the substrate in the treatment space so that a pattern surface of the substrate faces upwards, a lower supply line connected to a bottom of the treatment space to supply the supercritical fluid to the treatment space, and an upper supply line connected to a top of the treatment space to supply the supercritical fluid to the treatment space, wherein the controller may control the fluid supply unit such that in the pressurizing step, the supercritical fluid may be supplied to a bottom region of the substrate through the lower supply line, and in the treating step, the supercritical fluid may be supplied to a top region of the substrate through the upper supply line.

The controller may control the fluid supply unit such that the treating step may be performed such that a supply step for supplying the supercritical fluid to the treatment space and an exhaust step for exhausting the supercritical fluid from the treatment space are sequentially repeated a plurality of times, and a density of the supercritical fluid supplied to the treatment space in one supply step of the repeated supply steps and a density of the supercritical fluid supplied to the treatment space in another supply step of the repeated supply steps are different from each other.

The controller may control the fluid supply unit such that an amount of the supercritical fluid per unit time as supplied to the treatment space in the supply step may be smaller than an amount of the supercritical fluid per unit time as supplied to the treatment space in the pressurizing step.

The controller may control the fluid supply unit such that a temperature of the supercritical fluid supplied to the treatment space in the supply step may be higher than a temperature of the supercritical fluid supplied to the treatment space in the pressurizing step.

The controller may control the fluid supply unit such that a temperature of the supercritical fluid supplied to the treatment space in the exhaust step may be higher than a temperature of the supercritical fluid supplied to the treatment space in the pressurizing step or a temperature of the supercritical fluid supplied to the treatment space in the supply step.

The treating of the substrate may include a process in which an organic solvent remaining on the substrate may be dissolved in the supercritical fluid, thereby to remove the organic solvent from the substrate.

The supercritical fluid may include carbon dioxide.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a view schematically showing an example of a fluid supply unit for supplying supercritical fluid;

FIG. 5 is a view showing a state of supplying supercritical fluid of a first density or a second temperature from the fluid supply unit of FIG. 4 to a chamber;

FIG. 7 is a view schematically showing another example of a fluid supply unit for supplying supercritical fluid;

FIG. 8 is a view showing a state of supplying supercritical fluid of a first density or a second temperature from the fluid supply unit of FIG. 7 to a chamber;

DETAILED DESCRIPTION

Figure 1:
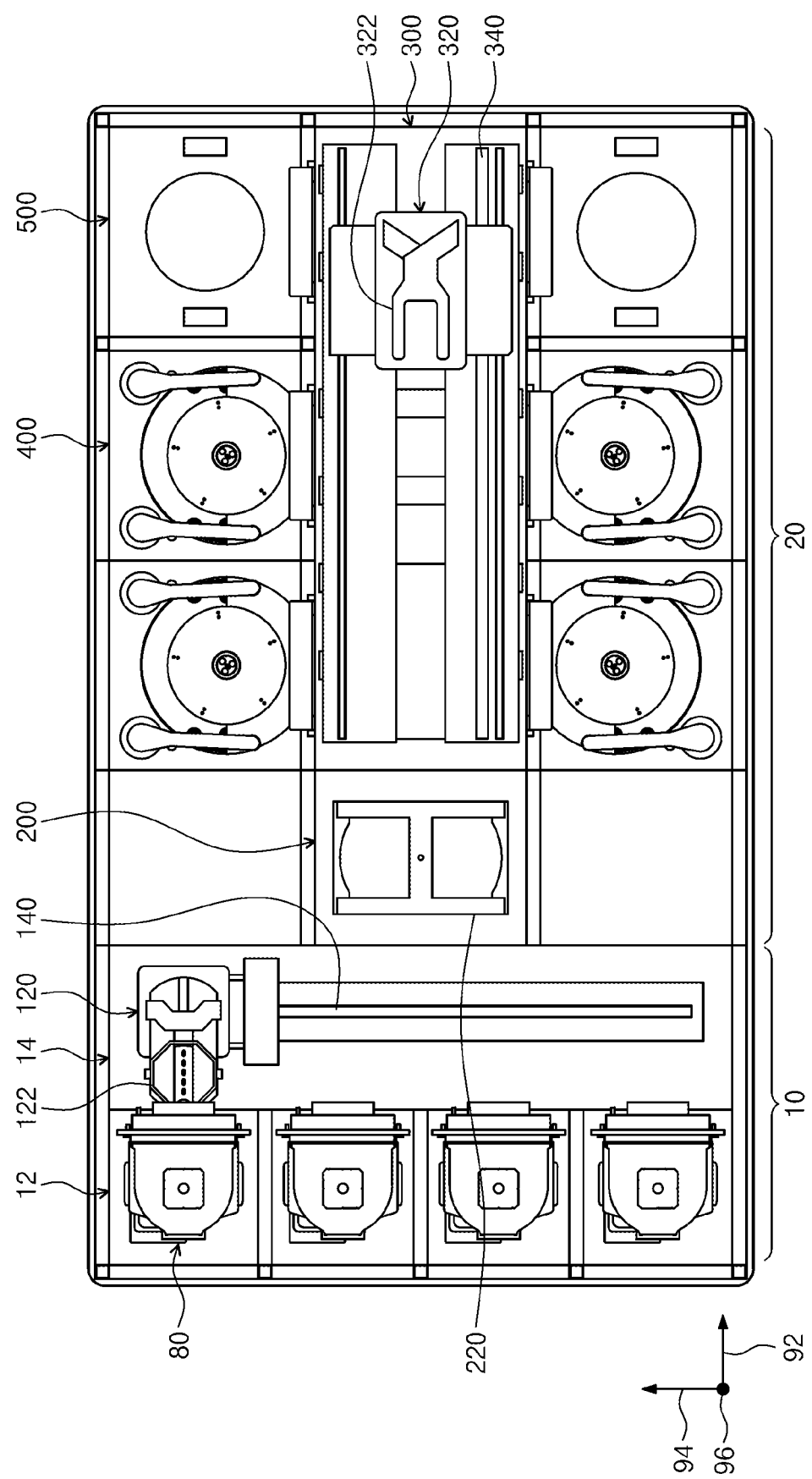
FIG. 1 is a plan view schematically showing a substrate treating apparatus according to an embodiment of the inventive concept.

Hereinafter, embodiments of the inventive concept will be described in more detail with reference to the accompanying drawings. The embodiments of the inventive concept may be modified in various forms. The scope of the inventive concept should not be construed as being limited to the embodiments below. The embodiments are provided to explain the inventive concept more fully to those skilled in the art. Therefore, a shape of each of elements in the drawings is exaggerated for clearer description.

FIG. 1 is a plan view schematically showing a substrate treating system according to an embodiment of the inventive concept. Referring to FIG. 1, the substrate treating system includes an index module 10, a treating module 20, and a controller (not shown). In one embodiment, the index module 10 and the treating module 20 are arranged along one direction. Hereinafter, the direction in which the index module 10 and the treating module 20 are arranged is referred to as a first direction 92. When viewed from above, a direction perpendicular to the first direction 92 is referred to as a second direction 94. A direction perpendicular to both the first direction 92 and the second direction 94 is referred to as a third direction 96.

The index module 10 transfers a substrate W from a container 80 where the substrate W is stored to the treating module 20 and transfers the substrate W treated in the treating module 20 to the container 80. A length direction of the index module 10 is the second direction 94. The index module 10 has a load port 12 and an index frame 14. The load port 12 is opposite to the treating module 20 around the index frame 14. The container 80 containing the substrates W therein is placed on the load port 12. A plurality of load ports 12 may be provided. The plurality of load ports 12 may be arranged along the second direction 94.

The container 80 may include a sealing container such as FOUP (Front Open Unified Pod). The container 80 may be placed on the load port 12 by an operator or transfer means (not shown) such as an overhead transfer, an overhead conveyor, or an automatic guided vehicle.

The index frame 14 has an index robot 120. The index frame 14 has a guide rail 140 whose a length direction is the second direction 94. The index robot 120 may be configured to be movable on the guide rail 140. The index robot 120 includes a hand 122 on which the substrate W is placed. The hand 122 may be configured to be capable of moving forward and backward, rotating about the third direction 96, and moving along the third direction 96. A plurality of hands 122 may be arranged and may be spaced apart from each other in a vertical direction. The hands 122 may move forward and backward independently of each other.

The treating module 20 includes a buffer unit 200, a transfer apparatus 300, a liquid treating apparatus 400, and a supercritical apparatus 500. The buffer unit 200 provides a space in which the substrate W carried into the treating module 20 and the substrate W carried out from the treating module 20 temporarily stay. The liquid treating apparatus 400 performs a liquid treating process of supplying liquid on the substrate W to treat the substrate W using the liquid. The supercritical apparatus 500 performs a drying process to remove the liquid remaining on the substrate W. The transfer apparatus 300 transports the substrate W between the buffer unit 200, the liquid treating apparatus 400, and the supercritical apparatus 500.

The transfer apparatus 300 may have a length direction of the first direction 92. The buffer unit 200 may be disposed between the index module 10 and the transfer apparatus 300. The liquid treating apparatus 400 and the supercritical apparatus 500 may be disposed on a side portion of the transfer apparatus 300. The liquid treating apparatus 400 and the transfer apparatus 300 may be arranged along the second direction 94. The supercritical apparatus 500 and the transfer apparatus 300 may be arranged along the second direction 94. The buffer unit 200 may be located at one end of the transfer apparatus 300.

In one example, the liquid treating apparatuses 400 may be disposed on both sides of the transfer apparatus 300, respectively. The supercritical apparatuses 500 may be disposed on both sides of the transfer apparatus 300, respectively. The liquid treating apparatuses 400 may be closer to the buffer unit 200 than to the supercritical apparatus 500. On one side of the transfer apparatus 300, the liquid treating apparatuses 400 may be arranged in a matrix of A×B (each of A and B being a natural number of 1 or greater) along the first direction 92 and the third direction 96, respectively. Further, on one side of the transfer apparatus 300, the supercritical apparatuses 500 may be arranged in a matrix of C×D (each of C and D being a natural number of 1 or greater) along the first direction 92 and the third direction 96, respectively. Alternatively, only the liquid treating apparatuses 400 may be disposed on one side of the transfer apparatus 300, while only the supercritical apparatuses 500 may be disposed on the other side thereof.

The transfer apparatus 300 has a transfer robot 320. The transfer apparatus 300 has a guide rail 340 whose a length direction is the first direction 92. The transfer robot 320 may be configured to be movable on the guide rail 340. The transfer robot 320 includes a hand 322 on which the substrate W is placed. The hand 322 may be configured to be able to move forward and backward, rotate about the third direction 96, and move along the third direction 96. A plurality of hands 322 may be arranged and spaced apart from each other in the vertical direction. The hands 322 may move forward and backward independently of each other.

The buffer unit 200 has a plurality of buffers 220 on which the substrate W is placed. The buffers 220 may be constructed to be spaced apart from each other along the third direction 96. The buffer unit 200 has an open front surface and an open rear surface. The front surface faces the index module 10, and the rear surface faces the transfer apparatus 300. The index robot 120 accesses the buffer unit 200 through the front surface. The transfer robot 320 may access the buffer unit 200 through the rear surface.

Figure 2:
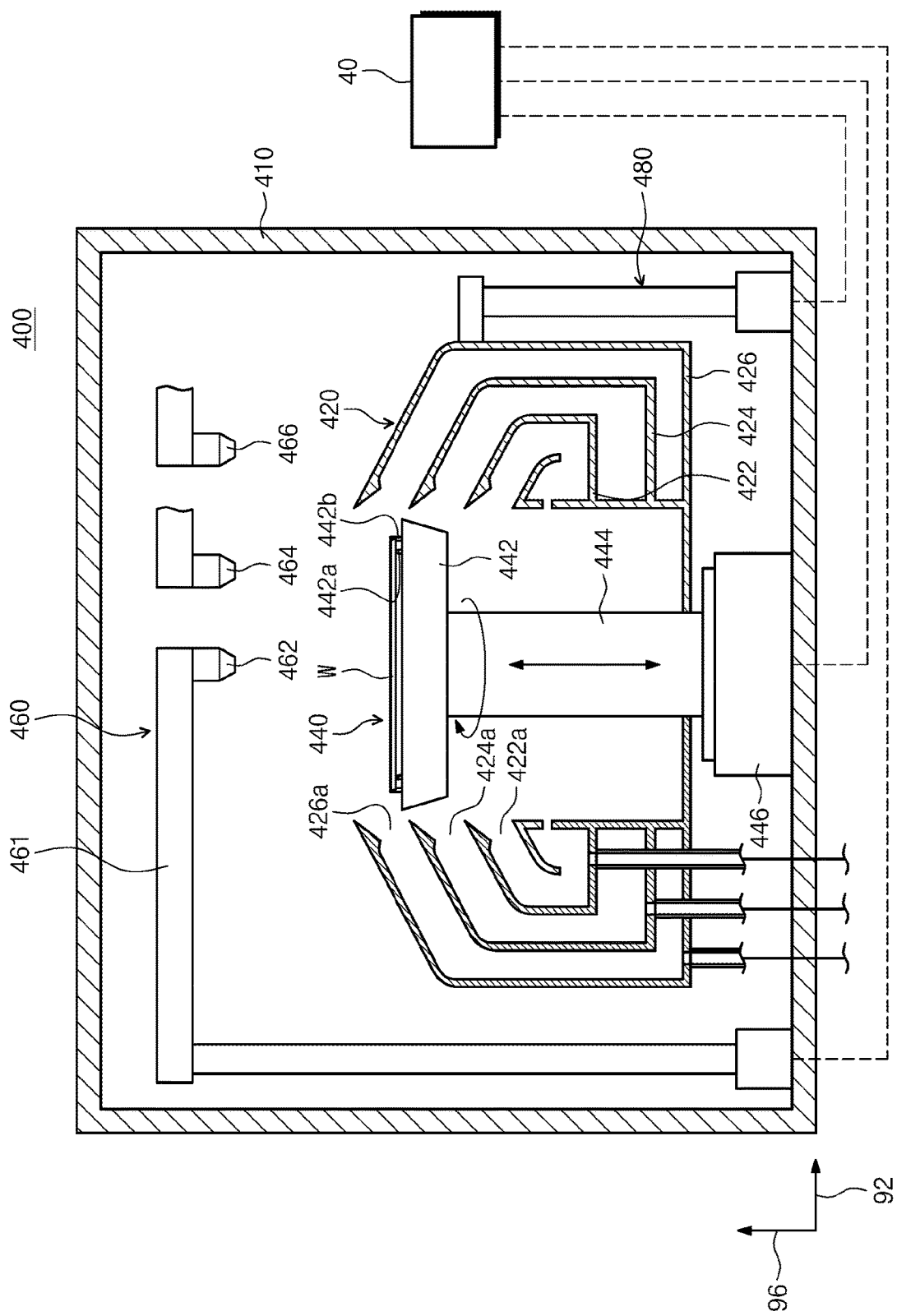
FIG. 2 is a diagram schematically showing one embodiment of a liquid treating apparatus of FIG. 1.

FIG. 2 is a diagram schematically showing one embodiment of the liquid treating apparatus 400 of FIG. 1. Referring to FIG. 2, the liquid treating apparatus 400 has a housing 410, a cup 420, a support unit 440, a liquid supply unit 460, an ascending and descending unit 480, and a controller 40. The controller 40 controls an operation of each of the support unit 440, the liquid supply unit 460, and the ascending and descending unit 480. The housing 410 is generally formed in a rectangular parallelepiped shape. The cup 420, the support unit 440, and the liquid supply unit 460 are disposed in the housing 410.

The cup 420 has a treatment space with an open top. The substrate W is treated with liquid in the treatment space. The support unit 440 supports the substrate W within the treatment space. The liquid supply unit 460 supplies the liquid onto the substrate W supported by the support unit 440. The liquid has plural types. The liquids of the plural types may be fed sequentially onto the substrate W. The ascending and descending unit 480 adjusts a relative height between the cup 420 and the support unit 440.

In one example, the cup 420 has a plurality of collection vessels 422, 424, and 426. Each of the collection vessels 422, 424, and 426 has a collection space for collecting the liquid used to treat the substrate. Each of the collection vessels 422, 424, and 426 is formed in a ring shape surrounding the support unit 440. As the liquid treating process proceeds, pre-treatment liquid scattered by rotation of the substrate W enters the collection space through each of inlets 422a, 424a, and 426a of the collection vessels 422, 424, and 426, respectively. In one example, the cup 420 has the first collection vessel 422, the second collection vessel 424, and the third collection vessel 426. The first collection vessel 422 is constructed to surround the support unit 440, the second collection vessel 424 is constructed to surround the first collection vessel 422, and the third collection vessel 426 is constructed to surround the second collection vessel 424. The second inlet 424a through which the liquid is fed into the second collection vessel 424 may be located above the first inlet 422a through which the liquid is fed into the first collection vessel 422. The third inlet 426a through which the liquid is fed into the third collection vessel 426 may be positioned above the second inlet 424a.

The support unit 440 has a support plate 442 and a drive shaft 444. A top surface of the support plate 442 may be generally formed in a circular shape and may have a larger diameter than that of the substrate W. A support pin 442a is disposed at a center of the support plate 442 to support a rear surface of the substrate W. The support pin 442a has a top protruding from the support plate 442 so that the substrate W is spaced, by a certain distance, from the support plate 442. A chuck pin 442b is disposed at an edge of the support plate 442.

The chuck pin 442b protrudes upward from the support plate 442 and supports a side portion of the substrate W so that the substrate W does not deviate from the support unit 440 when the substrate W is rotated. The drive shaft 444 is driven by an actuator 446, and is connected to a center of a bottom surface of the substrate W, and rotates the support plate 442 about a central axis thereof.

In one example, the liquid supply unit 460 has a first nozzle 462, a second nozzle 464, and a third nozzle 466. The first nozzle 462 feeds first liquid onto the substrate W. The first liquid may be liquid removing a film or foreign substances remaining on the substrate W. The second nozzle 464 feeds second liquid onto the substrate W. The second liquid may be liquid soluble in third liquid. For example, the second liquid may be liquid that is more soluble in the third liquid than the first liquid is. The second liquid may be liquid that neutralizes the first liquid supplied on the substrate W. Further, the second liquid may be liquid that neutralizes the first liquid and at the same time is more soluble in the third liquid than the first liquid is.

In one example, the second liquid may be water. The third nozzle 466 feeds the third liquid onto the substrate W. The third liquid may be liquid that is well soluble in supercritical fluid used in the supercritical apparatus 500. For example, the third liquid may be liquid that is more soluble in the supercritical fluid used in the supercritical apparatus 500 than the second liquid is. In one example, the third liquid may be an organic solvent. The organic solvent may be isopropyl alcohol (IPA). In one example, the supercritical fluid may be carbon dioxide.

The first nozzle 462, the second nozzle 464, and the third nozzle 466 are supported on different arms 461. These arms 461 may be moved independently. Alternatively, the first nozzle 462, the second nozzle 464, and the third nozzle 466 may be mounted on the same arm and moved simultaneously.

The ascending and descending unit 480 moves the cup 420 in the vertical direction. The relative height between the cup 420 and the substrate W is changed due to the vertical movement of the cup 420. Accordingly, the collection vessels 422, 424, and 426 for collecting the pre-treatment liquid are changed according to a type of the liquid supplied to the substrate W, so that the liquids may be collected, separately. Alternatively, the cup 420 may be fixedly installed, and the ascending and descending unit 480 may move the support unit 440 in the vertical direction.

Figure 3:
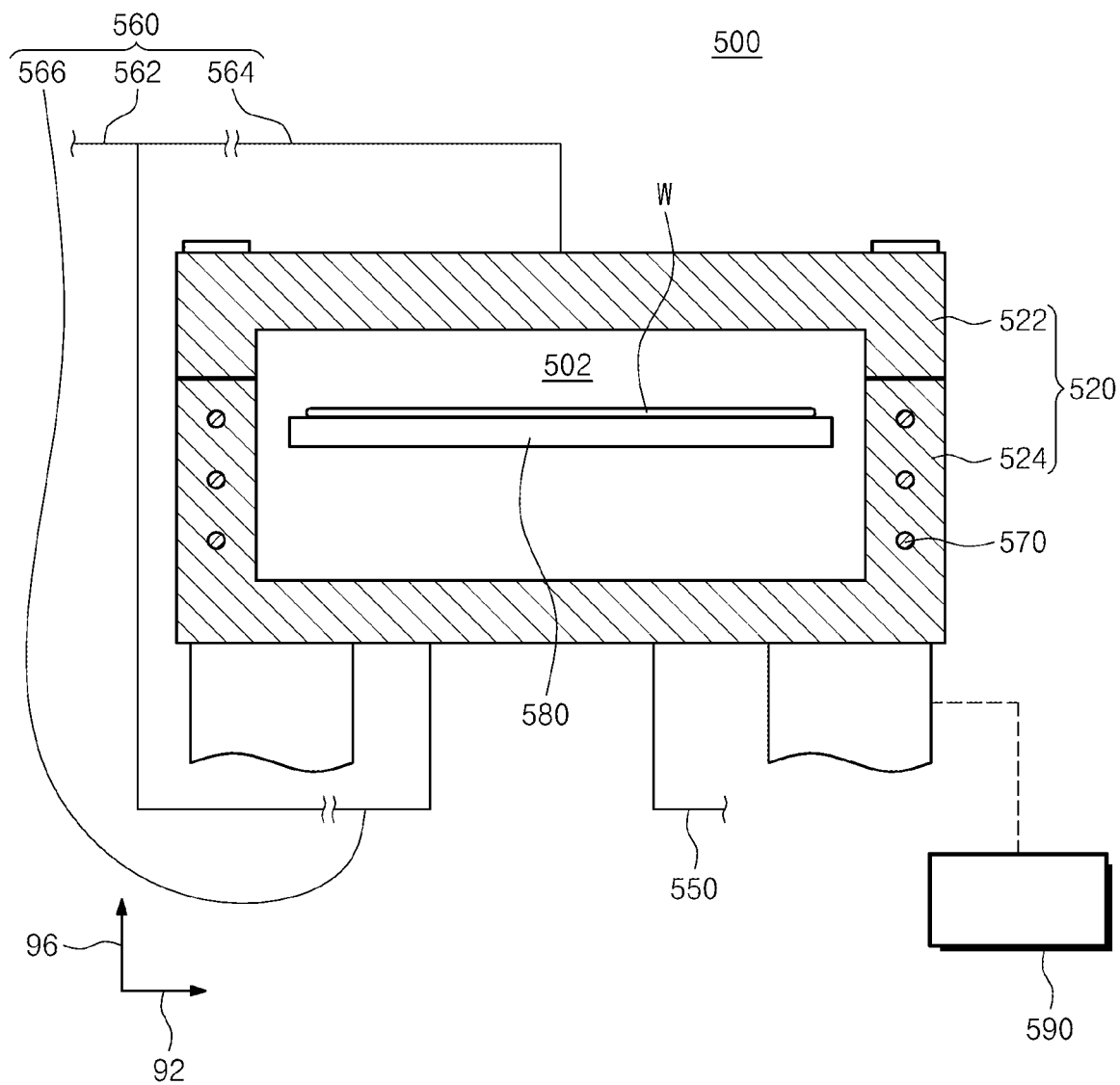
FIG. 3 is a diagram schematically showing one embodiment of a supercritical apparatus of FIG. 1.

FIG. 3 is a diagram schematically showing one embodiment of the supercritical apparatus 500 of FIG. 1. According to one embodiment, the supercritical apparatus 500 uses the supercritical fluid to remove the liquid on the substrate W. In one example, the liquid on the substrate W may be IPA. The supercritical apparatus 500 may supply the supercritical fluid onto the substrate W to dissolve IPA on the substrate W in the supercritical fluid to remove IPA from the substrate W.

The supercritical apparatus 500 has a process chamber 520, a fluid supply unit 560, a support apparatus 580, and an exhaust line 550.

The process chamber 520 provides a treatment space 502 in which a cleaning process is performed. The process chamber 520 has an upper housing 522, and a lower housing 524. The upper housing 522 and the lower housing 524 are combined with each other to provide the treatment space 502 as described above. The upper housing 522 is located above the lower housing 524.

The upper housing 522 has a fixed position. The lower housing 524 may be moved up and down by a driving member 590 such as a cylinder. When the lower housing 524 is separated from the upper housing 522, the treatment space 502 is opened, and thus the substrate W is brought into or out of the treatment space 502.

During the process, the lower housing 524 is in close contact with the upper housing 522, and thus the treatment space 502 is sealed from an outside. A heater 570 is located inside a wall of the process chamber 520. The heater 570 heats the treatment space 502 of the process chamber 520 so that the fluid supplied into the interior space of the process chamber 520 maintains a supercritical state. The interior of the treatment space 502 has an atmosphere of the supercritical fluid.

The support apparatus 580 supports the substrate W within the treatment space 502 of the process chamber 520. The substrate W brought into the treatment space 502 of the process chamber 520 is placed on the support apparatus 580. In one example, the substrate W is supported on the support apparatus 580 while a pattern surface thereof faces upwards.

The fluid supply unit 560 supplies cleaning fluid for treating the substrate into the treatment space 502 of the process chamber 520. In one example, the fluid supply unit 560 has a main supply line 562, a upper supply line 564 and a lower supply line 566. The upper supply line 564 and the lower supply line 566 are branched from the main supply line 562. The upper supply line 564 may be coupled to a center of the upper housing 522. In one example, the lower supply line 566 may be coupled to a center of the lower housing 524. Further, an exhaust line is coupled to the lower housing 524. The supercritical fluid in the treatment space 502 of the process chamber 520 is exhausted out of the process chamber 520 through the exhaust line.

FIG. 4 is a diagram schematically showing the fluid supply unit 560 according to one embodiment of the inventive concept. Referring to FIG. 4, the fluid supply unit 560 supplies the supercritical fluid to the treatment space 502.

The fluid supply unit 560 has a first reservoir 615 and a second reservoir 625. The first reservoir 615 and the second reservoir 625 are connected to a fluid supply source (not shown) to receive carbon dioxide from the fluid supply source. The fluid supply source may include a circulation line connected to a tank or the process chamber. The first reservoir 615 is installed at a first supply line 610. The second reservoir 625 is installed at a second supply line 620. In one example, the first supply line 610 and the second supply line 620 are connected to the main supply line 562. The first supply line 610 and the second supply line 620 are connected in parallel with each other. A heater for heating the supercritical fluid may be disposed at each of the first supply line 610 and the second supply line 620. The heater disposed in the first supply line 610 and the heater disposed in the second supply line 620 may have different outputs.

In one example, each of the first reservoir 615 and the second reservoir 625 may store carbon dioxide in a supercritical state. Temperatures, pressures, or densities of the supercritical fluids stored in the first reservoir 615 and the second reservoir 625 may be different from each other. For example, the first reservoir 615 may store the supercritical fluid of the first density, and the second reservoir 625 may store the supercritical fluid of a second density. The first density is different from the second density. For example, the second density may be higher than the first density.

The first reservoir 615 and the second reservoir 625 have different internal temperatures or/and pressures. Thus, densities of carbon dioxides in the first reservoir 615 and the second reservoir 625 may be different from each other. For example, the density of carbon dioxide in the supercritical state in the first reservoir 615 may be 200 kg/m$^3$ to 400 kg/m$^3$, while the density of carbon dioxide in the supercritical state in the second reservoir 625 may be 600 kg/m$^3$ to 800 kg/m$^3$.

Alternatively, the first reservoir 615 may store carbon dioxide therein at a second temperature, and the second reservoir 625 may store carbon dioxide therein at a first temperature. The first temperature is different from the second temperature. For example, the second temperature may be a temperature higher than the first temperature.

Alternatively, the first reservoir 615 may store carbon dioxide therein at a first pressure, and the second reservoir 625 may store carbon dioxide therein at a second pressure. The first pressure and the second pressure are different from each other. For example, the second pressure may be higher than the first pressure.

Alternatively, the first reservoir 615 and the second reservoir 625 store carbon dioxide therein at the same density or/and the same temperature, and/or the same pressure. An output of a first heater 618 provided in the first supply line 610 and an output of a second heater 628 provided in the second supply line 620 may be different from each other, such that the density or/and temperature of carbon dioxide flowing through the first supply line 610 and the density or/and temperature of carbon dioxide flowing through the second supply line 620 are different from each other.

The first supply line 610 has a first pump 612, a first front valve 614, a first rear valve 616, and a first filter 619 installed thereat. The first pump 612 is installed at a front end of the first reservoir 615 to discharge carbon dioxide to the first reservoir 615. The first front valve 614 controls a flow rate of carbon dioxide discharged from the first pump 612 to the first reservoir 615. The first rear valve 616 controls a flow rate of carbon dioxide supplied from the first reservoir 615 to the first heater 618. The first filter 619 is present downstream of the first heater 618 to remove impurities flowing in the first supply line 610. A first adjustment valve 617 adjusts a flow rate of the supercritical fluid supplied from the first supply line 610 to the treatment space 502.

The second supply line 620 has a second pump 622, a second front valve 624, a second rear valve 626 and a second filter 629 installed thereat, which are arranged in the same manner in which the first pump 612, the first front valve 614, the first rear valve 616 and the first filter 619 of the first supply line 610 are arranged. The second pump 622 is installed at a front end of the second reservoir 625 to discharge carbon dioxide into the second reservoir 625. The second front valve 624 controls a flow rate of carbon dioxide discharged from the second pump 622 to the second reservoir 625. The second rear valve 626 controls a flow rate of carbon dioxide supplied from the second reservoir 625 to the second heater 628. The second filter 629 is present downstream of the second heater 628 to remove impurities flowing in the second supply line 620. A second adjustment valve 627 adjusts a flow rate of the supercritical fluid supplied from the second supply line 620 to the treatment space 502.

The controller may control the components of the fluid supply unit 560. When carbon dioxide is intended to be fed to the treatment space 502 at a relatively low density as the first density or a relatively high temperature as the second temperature, the controller opens the first front valve 614, the first rear valve 616 and the first adjustment valve 617, and closes the second front valve 624, the second rear valve 626 and the second adjustment valve 627 as shown in FIG. 5 such that the carbon dioxide stored in the first reservoir 615 is supplied to the treatment space 502 through the first supply line 610.

Figure 6:
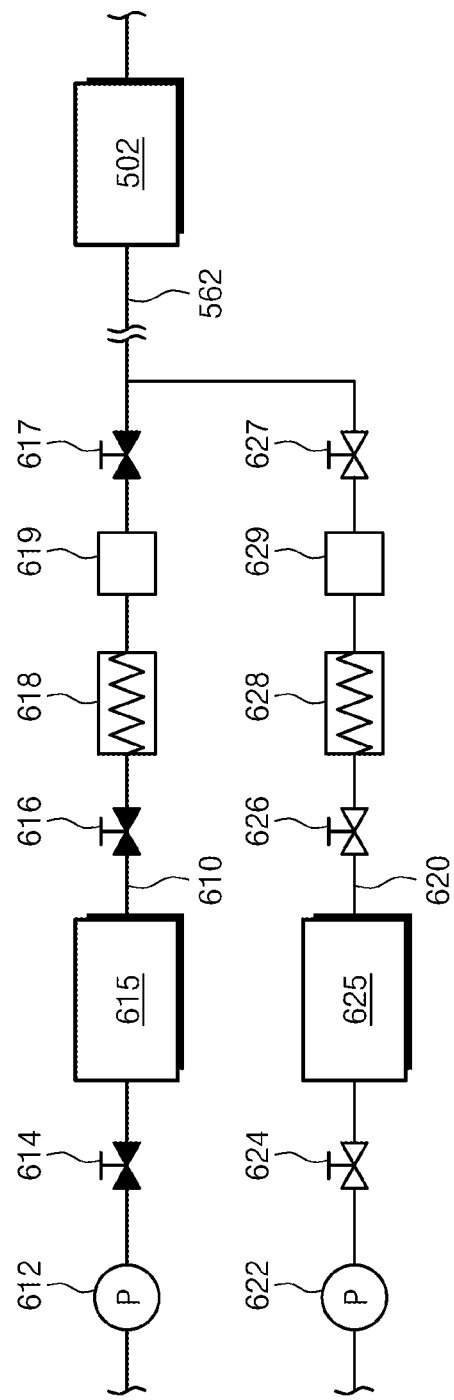
FIG. 6 is a view showing a state of supplying supercritical fluid of a second density or a first temperature from the fluid supply unit of FIG. 6 to a chamber.

When carbon dioxide is intended to be fed to the treatment space 502 at a relatively high density as the second density or a relatively low temperature as the first temperature, the controller opens the second front valve 624, the second rear valve 626 and the second adjustment valve 627 and closes the first front valve 614, the first rear valve 616 and the first adjustment valve 617, as shown in FIG. 6, such that the carbon dioxide stored in the second reservoir 625 is supplied to the treatment space 502 through the second supply line 620.

FIG. 7 is a diagram schematically showing another example of the fluid supply unit 560. Referring to FIG. 7, the fluid supply unit 560 has a reservoir 645, the main supply line 562, and a bypass line 630. The reservoir 645 is connected to the fluid supply source to receive carbon dioxide from the fluid supply source. The fluid supply source may include a circulation line connected to the tank or the process chamber. The reservoir 645 is installed at the main supply line 562.

In one example, the bypass line 630 allows the fluid flowing from the reservoir 645 to bypass a second heater 648. The bypass line 630 is connected to the main supply line 562 at a first point 631 and a second point 633. The first point 631 is located more upstream of the main supply line 562 than the second point 633 is. A first heater 668 and the second heater 648 are disposed at the main supply line 562. The first heater 668 is installed between the reservoir 645 and the first point 631. The second heater 648 is installed between the first point 631 and the second point 633. In one example, the second heater 648 may have a higher output than that of the first heater 668.

The main supply line 562 has a pump 642, valves 643, 646, and 647, and a filter 649 installed thereat. The pump 642 is installed at a front end of the reservoir 645 to discharge carbon dioxide into the reservoir 645. The front valve 643 controls a flow rate of carbon dioxide discharged from the pump 642 to the reservoir 645. The rear valve 646 regulates a flow rate of carbon dioxide supplied from the reservoir 645 to the first heater 668. A bypass valve 632 is installed at the bypass line 630. The filter 649 is disposed downstream of the second point 633 to remove impurities from the main supply line 562. The adjustment valve 647 adjusts a flow rate of the supercritical fluid supplied from the main supply line 562 to the treatment space 502.

An operation of the fluid supply unit 560 is controlled by a controller. When carbon dioxide is intended to be fed to the treatment space 502 at the relatively low density as the first density or the relatively high temperature as the second temperature, the controller opens the front valve 643, the rear valve 646 and the adjustment valve 647, and closes the bypass valve 632, as shown in FIG. 8, such that the carbon dioxide via the first heater 668 and the second heater 648 is supplied to the treatment space 502.

Figure 9:
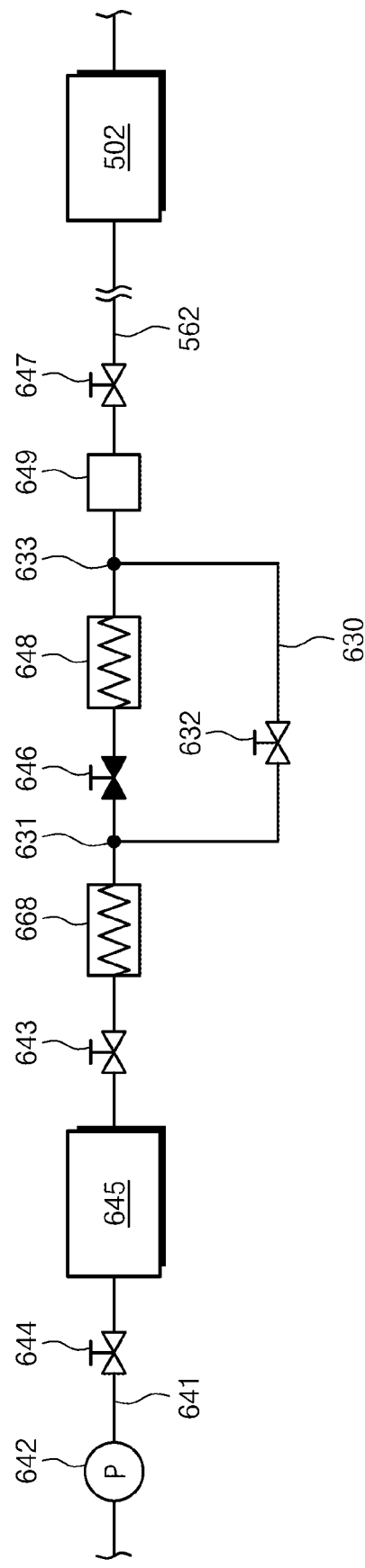
FIG. 9 is a view showing a state of supplying supercritical fluid of a second density or a first temperature from the fluid supply unit of FIG. 7 to a chamber.

When carbon dioxide is intended to be fed to the treatment space 502 at the second density of a relatively high density or the first temperature of a relatively low density, the controller opens the front valve 643, closes the rear valve 646 and opens the adjustment valve 647 and opens the bypass valve 632 as shown in FIG. 9, such that carbon dioxide is fed to the treatment space 502 via the first heater 668 while bypassing the second heater 648.

Figure 10:
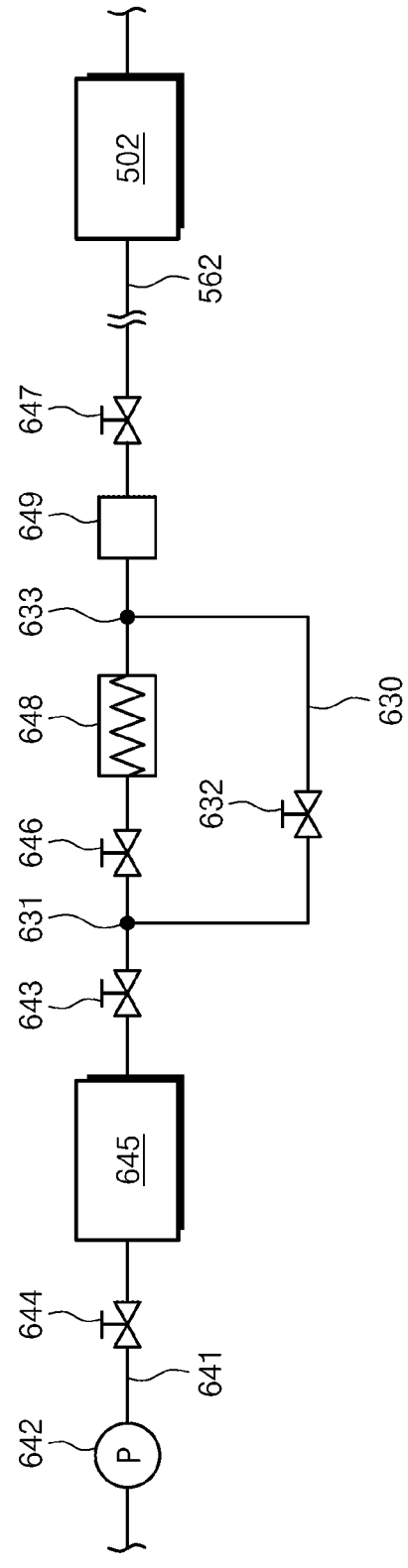
FIG. 10 is a view schematically showing a modification of the fluid supply unit of FIG. 7.

In the above-described example, it is illustrated that each of the first heater 668 and the second heater 648 is installed at the supply line. However, as shown in FIG. 10, the second heater 648 may be disposed between the first point 631 and the second point 633 in the supply line, while a heater may not be disposed between the reservoir and the first point 631.

Figure 11:
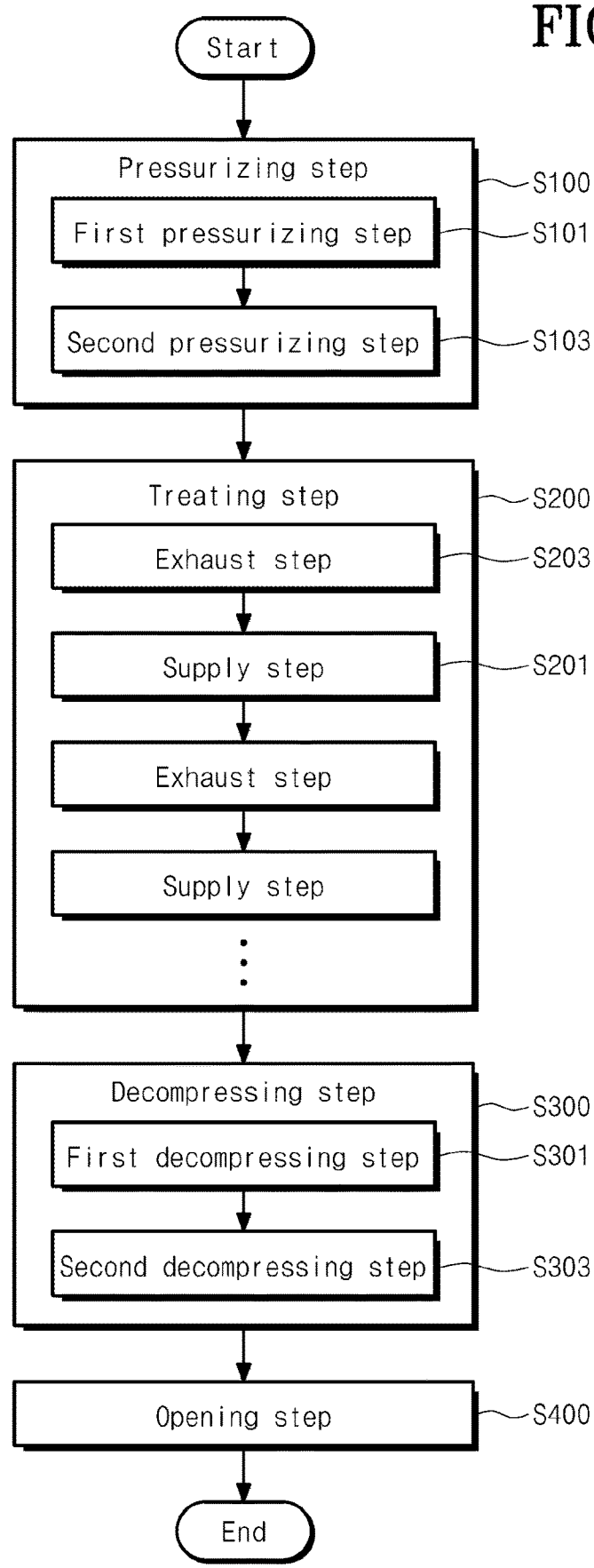
FIG. 11 is a view showing a flowchart of a substrate treating method according to one embodiment of the inventive concept.
Figure 12:
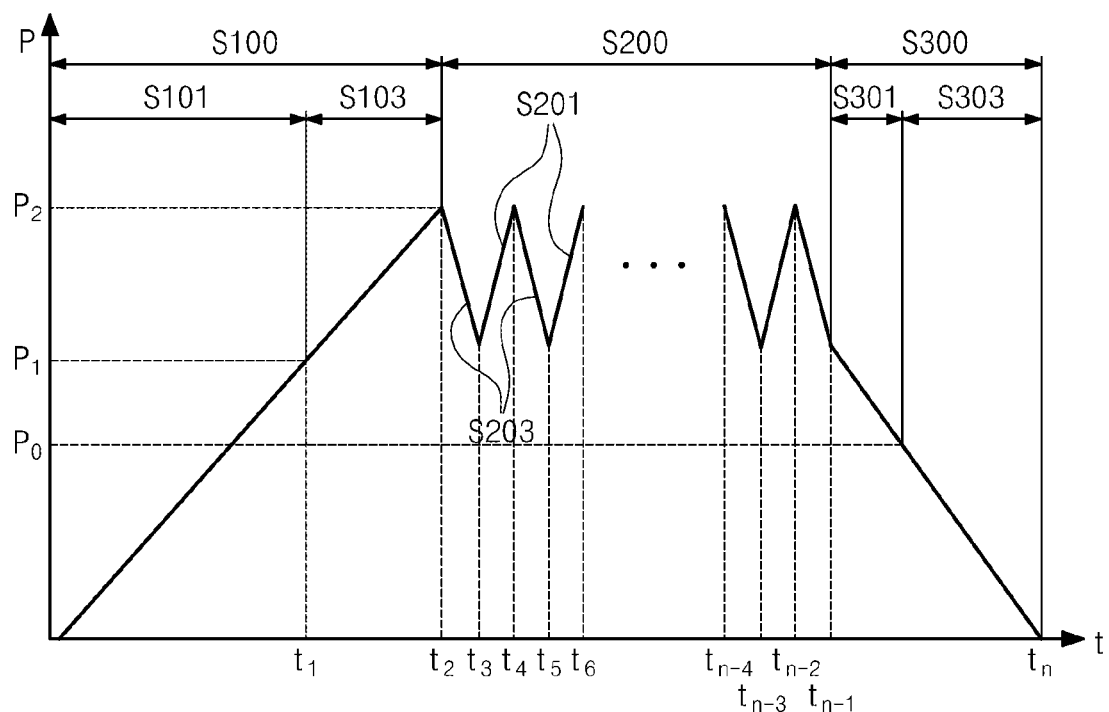
FIG. 12 is a view showing pressure change over time inside a chamber.

FIG. 11 is a view sequentially showing an apparatus for treating a substrate in a drying chamber according to one embodiment. FIG. 12 shows a pressure state in the treatment space over time. Referring to FIG. 11 and FIG. 12, the apparatus for treating the substrate may include a pressurizing step S100, a treating step S200, a decompressing step S300 and an opening step S400. When the substrate is brought into the treatment space 502, the pressurizing step S100 is performed. In the pressurizing step S100, the supercritical fluid is supplied to the treatment space 502 to pressurize the treatment space 502. Pressurization occurs until the interior of the treatment space 502 is at or above a critical pressure at which carbon dioxide becomes the supercritical fluid.

The pressurizing step S100 includes a first pressurizing step S101 and a second pressurizing step S103. In the first pressurizing step S101, carbon dioxide in the supercritical state is supplied to the treatment space 502 such that the treatment space 502 is pressurized to a preset pressure P1. Then, in the second pressurizing step S103, carbon dioxide in the supercritical state is supplied to the treatment space 502 such that the treatment space 502 is pressurized to a target pressure P2. In one example, the preset pressure P1 to which the treatment space 502 is pressurized in the first pressurizing step S101 may be 70 bar, and the target pressure P2 to which the treatment space 502 is pressurized in the second pressurizing step S103 may be 150 bar. Carbon dioxide may be supplied at a higher density in the first pressurizing step S101 than in the second pressurizing step S103.

The treating step S200 supplies the supercritical fluid to the treatment space 502 to treat the substrate with the supercritical fluid. The treating step S200 includes a supply step S201 and an exhausting step S203. The supply step S201 and the exhausting step S203 are performed sequentially and repeatedly. Carbon dioxide is supplied to the treatment space 502 in the supply step S201. In the exhausting step S203, the treatment space 502 is exhausted.

When the treatment of the substrate is completed, the decompressing step S300 is carried out to allow the treatment space 502 to be exhausted. In one example, the decompressing is performed until a pressure inside the treatment space 502 reaches a normal pressure or a similar pressure thereto. When the decompressing step S300 is completed, the opening step S400 for opening the chamber is performed. Thus, when the chamber is opened, the substrate is taken out of the treatment space 502.

Figure 13:
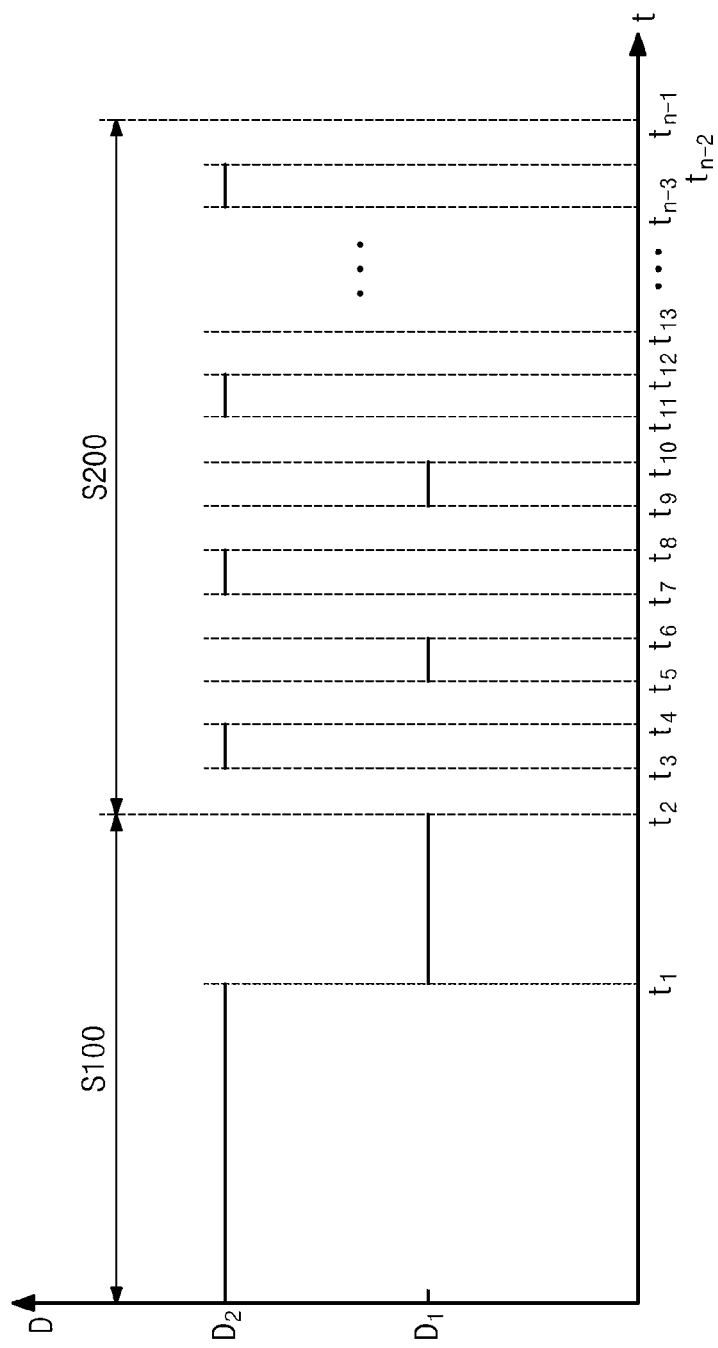
FIG. 13 to FIG. 16 are views schematically showing a density of carbon dioxide supplied to a treating chamber over time, respectively.

FIG. 13 to FIG. 16 are diagrams schematically showing a density of carbon dioxide supplied to the treatment chamber over time, respectively. Referring to FIG. 13, carbon dioxide has a higher density in the first pressurization step than that in the second pressurization step. For example, carbon dioxide of a second density D2 is supplied to the treatment space 502 in the first pressurizing step S101. In the second pressurizing step S103, carbon dioxide of a first density D1 lower than that of the carbon dioxide supplied in the first pressurizing step S101 is supplied to the treatment space 502. In one example, the first density D1 may be 200 kg/m$^3$ to 400 kg/m$^3$, and the second density D2 may be 600 kg/m$^3$ to 800 kg/m$^3$.

In the second pressurizing step S103, carbon dioxide is supplied at a relatively low density such that a diffusion rate of carbon dioxide in the treatment space 502 is increased. The carbon dioxide diffused in the treatment space 502 actively dissolves IPA. Further, the relatively high density of carbon dioxide as first supplied moves from a bottom to a top of the substrate in the treatment space 502 over time, such that mixing of carbon dioxide and IPA occurs in a reliable manner.

In one example, in the first pressurizing step S101, carbon dioxide is supplied to the treatment space 502 at the second density D2. In the first pressurizing step S101, carbon dioxide is supplied at a relatively high density, such that a large amount of carbon dioxide is supplied to the treatment space 502 for a short time at a beginning of the pressurizing step S100. Thereafter, in the second pressurizing step S103, carbon dioxide is supplied to the treatment space 502 as the first density D1 lower than the second density D2.

In one example, the density of carbon dioxide supplied to the treatment space 502 in one step of supply steps of the supply step S201 may be different from the density of carbon dioxide supplied to the treatment space 502 in another step of the supply steps of the supply step S201. In one example, the density of carbon dioxide supplied to the treatment space 502 in the supply step S201 is the first density D1 or the second density D2. In one example, the supply of the supercritical fluid of the first density D1 and the supply of the supercritical fluid of the second density D2 may be alternately performed once among successive supply steps S201.

In the supply step S201, carbon dioxides having different densities may be repeatedly injected to obtain a stirring effect in which IPA and carbon dioxide are well mixed with each other in the treatment space 502, thereby to increase the solubility of IPA in carbon dioxide.

When a certain amount of IPA has been dissolved in carbon dioxide in a supercritical state, IPA is no longer dissolved in carbon dioxide. Therefore, the exhausting step S203 is performed to exhaust a certain amount of IPA dissolved in the carbon dioxide from the treatment space 502. Subsequently, the supply step S201 is performed to supply new carbon dioxide in the supercritical state to the treatment space 502, such that IPA is continuously dissolved in carbon dioxide. The exhausting step S203 and the supply step S201 are performed repeatedly.

In one example, in each of the supply steps S201, carbon dioxide may be supplied until a pressure in the treatment space 502 becomes the target pressure P2. In each of the exhausting steps S203, the exhausting of the treatment space 502 is carried out so that the pressure in the treatment space 502 maintains a pressure higher than a critical pressure.

Figure 14:
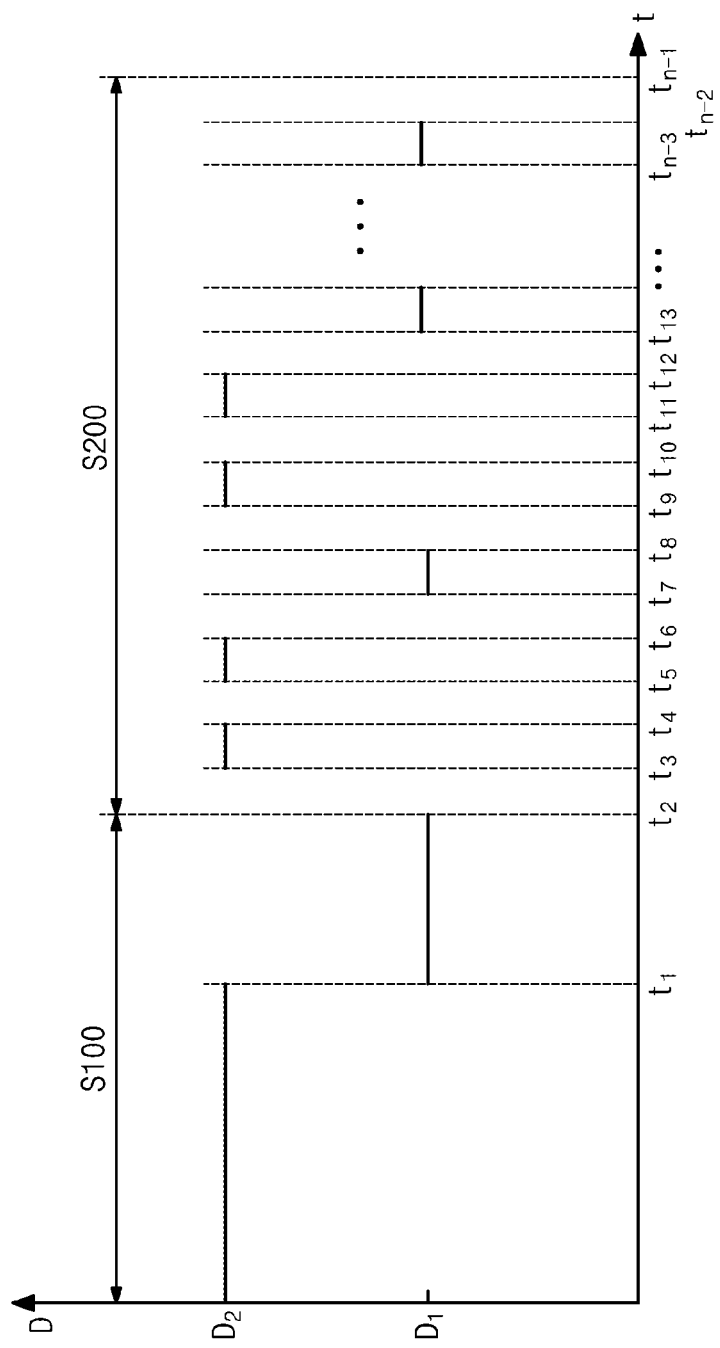

During the supply steps S201, the supercritical fluid of the first density D1 may be continuously supplied N times, and the supercritical fluid of the second density D2 may be continuously supplied M times. In one example, at least one of M and N may be 2 or greater. In one example, M and N may be different numbers. In one example, M may be a number greater than N. Referring to FIG. 14, during the continuous supply steps S201, the supercritical fluid of the second density D2 may be supplied twice, and, subsequently, in the supply step S201, the supercritical fluid of the first density may be supplied once.

According to the inventive concept, alternately supplying carbon dioxides having different densities to the treatment space 502 may achieve advantages of increasing a drying efficiency, minimizing a residual amount of IPA and reducing a process time of the treatment step S200.

Figure 15:
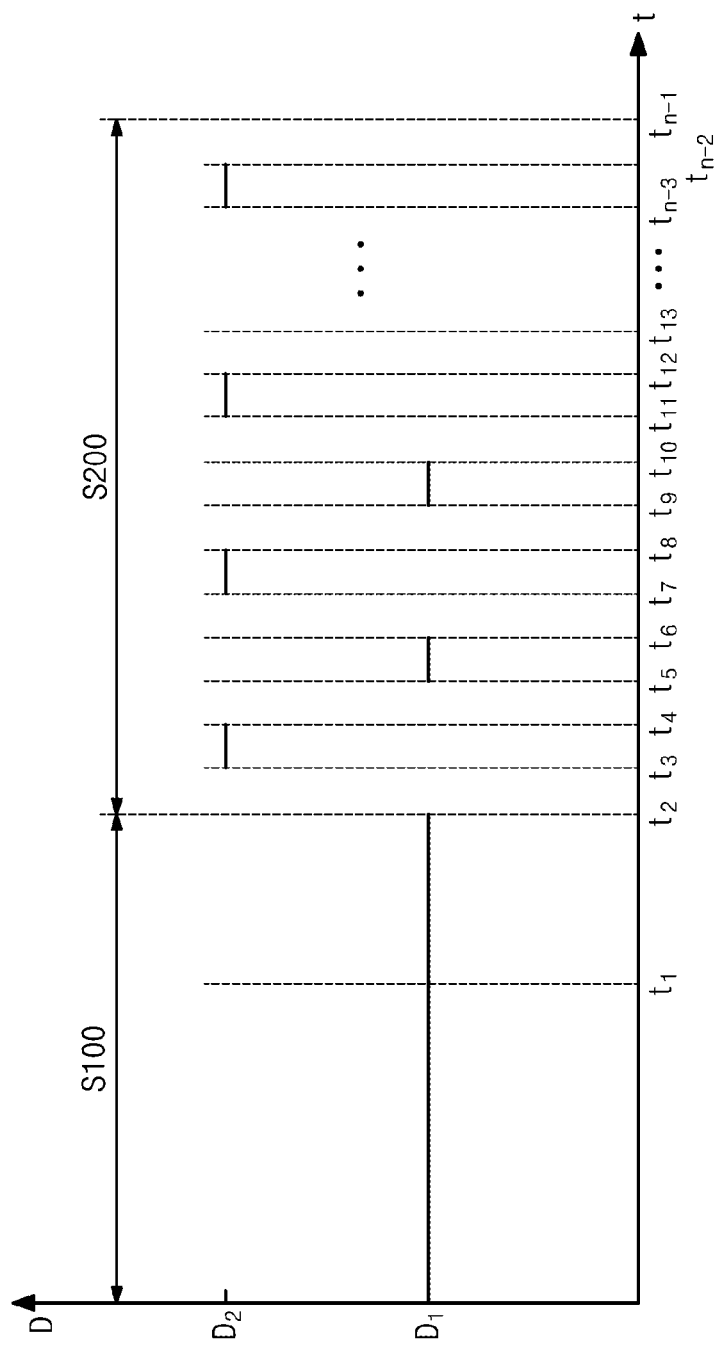
Figure 16:
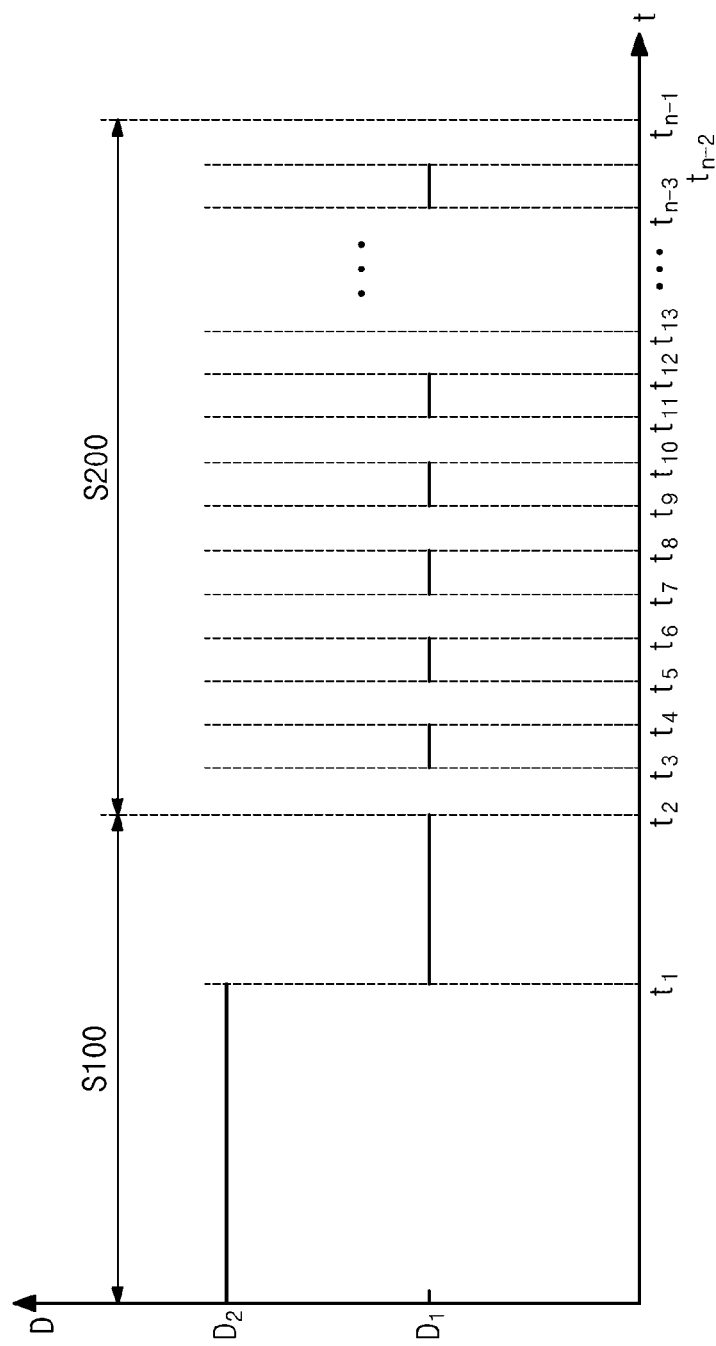

The example in which the supercritical carbon dioxide is fed to the treatment space at different densities thereof in each of the pressurizing step and the treating step has been described above. However, as shown in FIG. 15, in the pressurizing step S100, supercritical carbon dioxides may be supplied at the same density, and only in the treating step S200, the supercritical carbon dioxides may be supplied in different densities. Alternatively, as shown in FIG. 16, in the treatment step S200, the supercritical carbon dioxide may be supplied at the same density, and only in the pressurizing step S100, the supercritical carbon dioxides may be supplied in different densities.

The example in which the supercritical fluid is fed at the first density and the second density has been described above. However, the supercritical fluid may be fed at the first density, the second density higher than the first density, and a third density higher than the first density and lower than the second density. In one example, the first density may be 200 kg/m$^3$ to 400 kg/m$^3$. The second density may be 600 kg/m$^3$ to and 800 kg/m$^3$. The third density may be 400 kg/m$^3$ to 600 kg/m$^3$.

Figure 17:
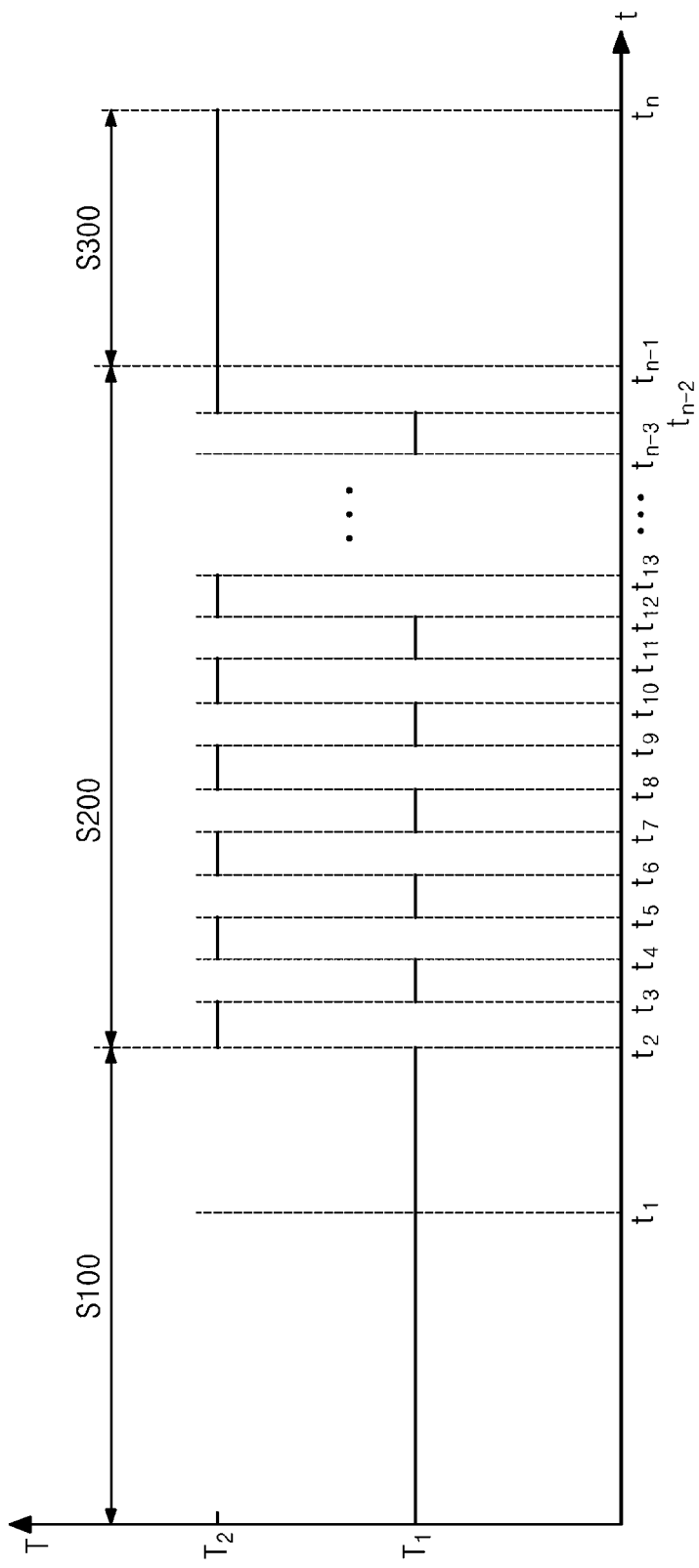
FIG. 17 to FIG. 19 are views schematically showing a temperature of carbon dioxide supplied to a treatment chamber over time, respectively.
Figure 18:
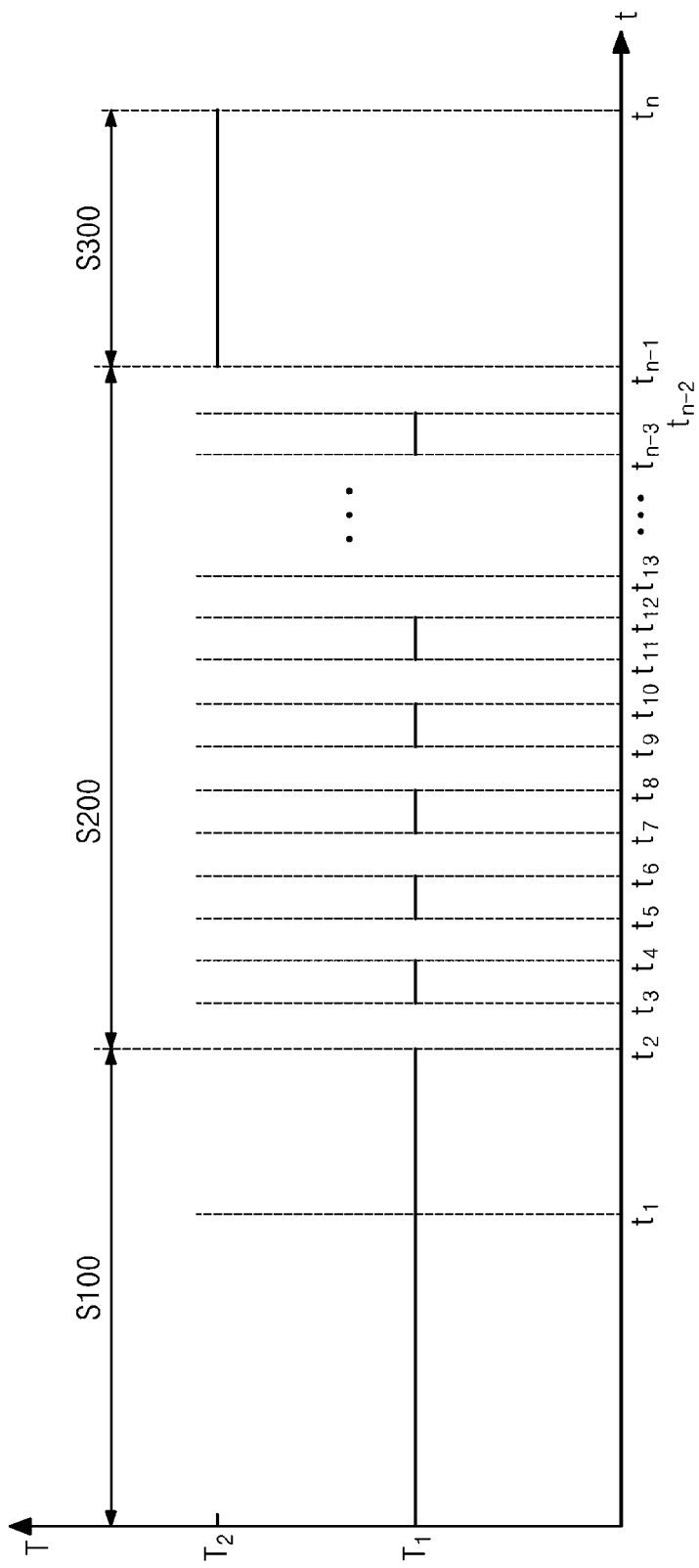
Figure 19:
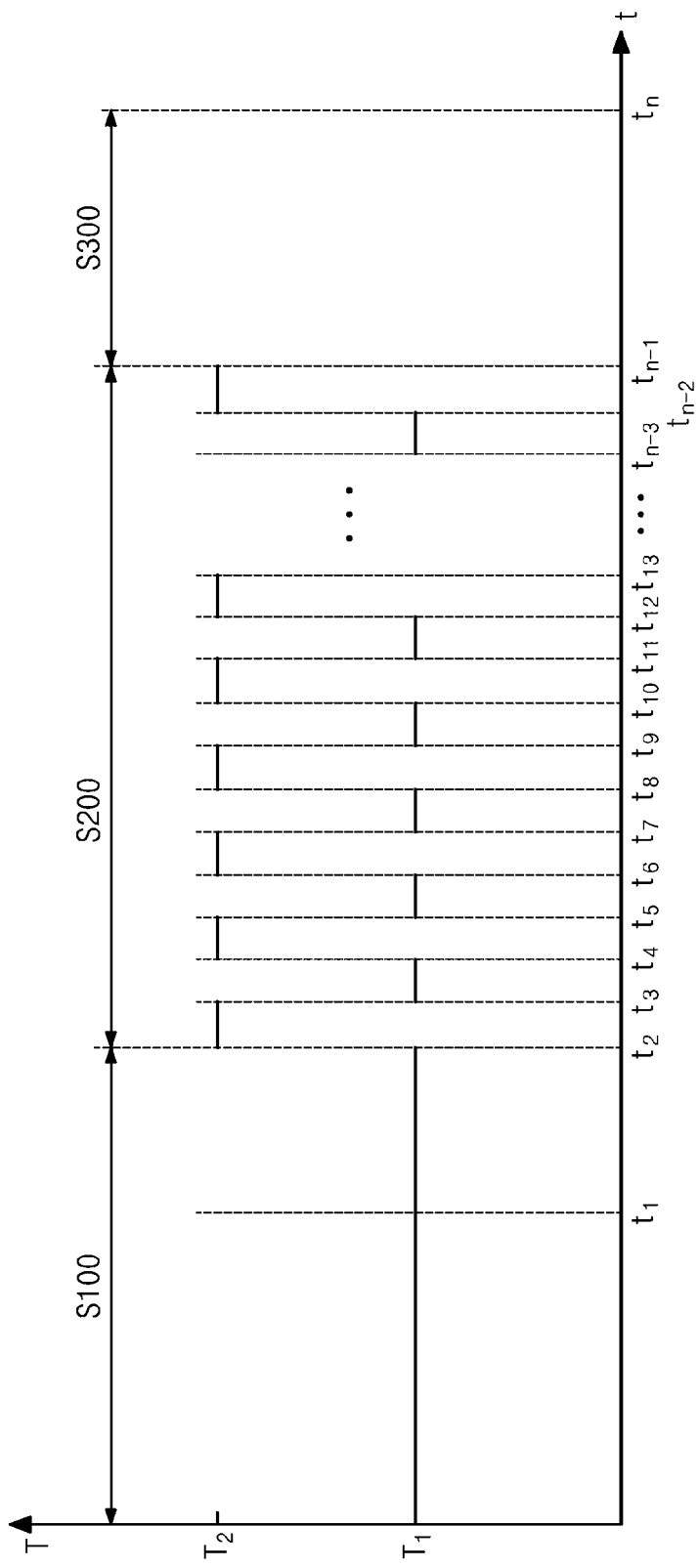

FIG. 17 to FIG. 19 are diagrams schematically showing a temperature of carbon dioxide supplied to the treatment chamber over time, respectively.

Referring to FIG. 17, in this embodiment, the supercritical carbon dioxide is supplied while the treatment space is exhausted. In one example, a temperature of carbon dioxide supplied to the treatment space 502 in the pressurizing step S100 is a first temperature T1.

Carbon dioxide supplied to the treatment space 502 in the exhausting step S203 has a relatively high temperature. A temperature of carbon dioxide supplied to the treatment space 502 in the exhausting step S203 may be higher than a temperature of carbon dioxide supplied to the treatment space 502 in the pressurizing step S100. In one example, the temperature of carbon dioxide supplied to the treatment space 502 in the exhausting step S203 is a second temperature T2.

The temperature of carbon dioxide supplied to the treatment space 502 in the decompressing step S300 may be higher than the temperature of carbon dioxide supplied to the treatment space 502 in the pressurizing step S100. In one example, the temperature of carbon dioxide supplied to the treatment space 502 in the decompressing step S300 is the second temperature T2.

Carbon dioxide in the supercritical state is supplied to the treatment space 502 in the pressuring step, the treating step and a first decompressing step S301. In one example, carbon dioxide is supplied in a supply amount Q1 per unit time in the first pressurizing step S101, and is supplied in a supply amount Q2 per unit time in the second pressurizing step S103. Q1 may be greater than Q2.

The amount of carbon dioxide per unit time as supplied in the supply step S201 is smaller than the amount of carbon dioxide per unit time as supplied in the pressurizing step S100. In one example, the amount of carbon dioxide per unit time as supplied in the supply step S201 is Q3. Q3 is smaller than Q2. Carbon dioxide may be supplied to the treatment space 502 in the exhausting step S203. The supply amount per unit time of carbon dioxide as supplied to the treatment space 502 in the exhausting step S203 is smaller than the supply amount per unit time of carbon dioxide as supplied to the treatment space 502 in the supply step S201. In one example, the supply amount per unit time of carbon dioxide as supplied in the exhaust stage is Q4. In the exhausting step S203, an exhausted amount of carbon dioxide per unit time is greater than the supply amount of carbon dioxide per unit time. In one example, the exhausted amount per unit time in the exhausting step S203 is V3. A relationship of V3>Q4 is established.

The supply amount per unit time of the supercritical fluid as supplied to the treatment space 502 in the first decompressing step S300 is smaller than the supply amount per unit time of the supercritical fluid as supplied to the treatment space 502 in the pressurizing step S100 or the supply step S201. In one example, in the first decompressing step S301, the supply amount of carbon dioxide per unit time is Q4, which is lower than Q3. The supply amount per unit time of carbon dioxide as supplied to the treatment space 502 in the first decompressing step S301 is smaller than the exhausted amount per unit time of carbon dioxide from the treatment space 502. In one example, the exhausted amount of carbon dioxide per unit time in the first decompressing step S301 is V2 higher than V3. A relationship of V2>Q4 is established.

In the second decompressing step S303, the treatment space 502 is exhausted without supply of carbon dioxide thereto. In one example, in the second decompressing step S303, the exhausted amount thereof per unit time is V1 higher than V2.

Figure 20:
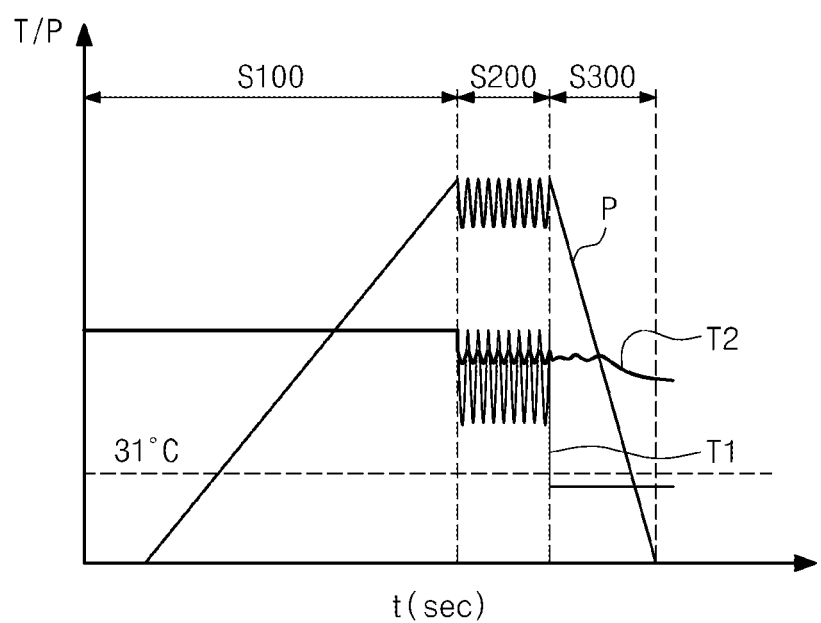
FIG. 20 is a graph showing a temperature T1 in a conventional chamber, and a temperature T2 and a pressure P inside a chamber according to the inventive concept.

FIG. 20 is a graph showing a temperature T1 in a conventional chamber, and a temperature T2 and a pressure P inside the chamber according to the inventive concept. Referring to FIG. 20, when the decompressing step S300 exhausts the treatment space 502, the temperature T1 inside the conventional process chamber rapidly decreases due to a sudden pressure drop. Thus, the solubility of IPA in the carbon dioxide decreases as the temperature inside the treatment space 502 decreases. When the temperature inside the treatment space 502 falls below 31 degrees Celsius, carbon dioxide in the supercritical state changes into a subcritical state. In the subcritical state of carbon dioxide, the solubility of IPA in the carbon dioxide is significantly reduced. Thus, carbon dioxide in the subcritical state forms a mixture with IPA to contaminate the substrate.

According to the inventive concept, the temperature T2 inside the chamber may be maintained at a high temperature by supplying carbon dioxide of a relatively high temperature in the exhausting step S203 and the decompressing step S300 in which the pressure drops down. Therefore, there is an advantage of maintaining the solubility of IPA in carbon dioxide at a high level. Further, due to the temperature compensation, the carbon dioxide inside the chamber is maintained in the supercritical state. Accordingly, the solubility of IPA in carbon dioxide is maintained. Thus, when decompressing the treatment space 502, IPA dissolved in carbon dioxide in the supercritical state is discharged outside the chamber. In one example, the lower limit of the second temperature is set to a value above the critical temperature of carbon dioxide, thereby to maintain the carbon dioxide inside the chamber in the supercritical state.

The example in which the carbon dioxide at the second temperature T2 is continuously supplied to the treatment space 502 while the decompressing step S300 is performed has been described above. However, carbon dioxide at the second temperature T2 may only be supplied in the first decompressing step S301.

The example in which the supply of carbon dioxide in the decompressing step S300 is initiated at the same time as start of the decompressing step S300 has been described above. However, in another example, the supply of carbon dioxide in the decompressing step S300 may be initiated in the middle of the decompressing step S300. In still another example, the supply of carbon dioxide in the decompressing step S300 may be initiated in the middle of the treating step S200.

The example in which carbon dioxide at a relatively high temperature is supplied to the treatment space 502 in the exhausting step S203 and the decompressing step S300 has been described above. However, as shown in FIG. 18, only in the decompressing step S300, carbon dioxide at the second temperature as a relatively high temperature may be supplied to the treatment space 502. Alternatively, carbon dioxide at the second temperature may be supplied to the treatment space 502 only in the exhausting step S203, as shown in FIG. 19.

The example in which the temperature of the carbon dioxide supplied to the treatment space 502 in the decompressing step S300 is the second temperature has been described above. However, the temperature of the carbon dioxide supplied to the treatment space 502 in the decompressing step S300 is higher than the second temperature as the temperature of carbon dioxide supplied to the treatment space 502 in the supply step S201.

According to one embodiment of the inventive concept, the substrate treating method and the substrate treating apparatus that may improve the drying efficiency of the substrate when drying the substrate using the supercritical fluid may be realized.

According to one embodiment of the inventive concept, when drying the substrate using the supercritical fluid, the supercritical fluids having the different densities may be provided such that IPA remaining on the substrate may be minimized.

The effect of the inventive concept is not limited to the above-described effects. Effects as not mentioned may be clearly understood by those skilled in the art to which the inventive concept belongs from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

REFERENCE NUMERALS

502: Treatment space
520: Process chamber

What is claimed is:

1. An apparatus for treating a substrate, the apparatus comprising:
  a process chamber having a treatment space defined therein;
  a support plate for supporting the substrate in the treatment space;
  a fluid supply conduit for supplying supercritical fluid to the treatment space;
  a controller configured to control the fluid supply conduit, wherein the fluid supply conduit is configured to selectively supply the supercritical fluid at a first density or a second density higher than the first density into the treatment space;
  a reservoir for containing the supercritical fluid;
  a supply line for supplying the supercritical fluid contained in the reservoir to the treatment space;
  a first heater installed at the supply line and located downstream of the reservoir;
  a bypass line connected to the supply line and configured to bypass the first heater, the bypass line being connected to a main supply line at a first point and a second point; and
  an adjustment valve configured to allow the supercritical fluid to flow in a selected direction among a direction toward the bypass line and a direction toward the first heater,
  wherein the first point is located at upstream of the main supply line than the first heater,
  wherein the second point is located at downstream of the main supply line than the first heater, and
  wherein the first heater is located in the main supply line between the first point and the second point,
  wherein another heater is not installed on the bypass line.

2. The apparatus of claim 1, wherein the apparatus further comprises a second heater installed at the supply line and disposed between the bypass line and the reservoir, or between the bypass line and the treatment space.

3. The apparatus of claim 1, wherein, depending upon the supercritical fluid flows through the first heater or flows through the bypass line, the supercritical fluid at the first density is supplied to the treatment space or the supercritical fluid at the second density is supplied to the treatment space, respectively.

4. The apparatus of claim 2, wherein, depending upon the supercritical fluid flows through the first heater and the second heater or the supercritical fluid flows through the second heater and the bypass line, the supercritical fluid at the first density is supplied to the treatment space or the supercritical fluid at the second density is supplied to the treatment space, respectively.

5. The apparatus of claim 1, wherein the controller is configured to control the fluid supply conduit to sequentially perform:
- a pressurizing step of supplying the supercritical fluid to the treatment space to pressurize the treatment space after the substrate is brought into the treatment space;
- a treating step of supplying the supercritical fluid to the treatment space to treat the substrate with the supercritical fluid; and
- a decompressing step of discharging the supercritical fluid out of the treatment space after the substrate treatment is completed.

6. The apparatus of claim 5, wherein the controller is configured to control the fluid supply conduit such that the pressurizing step includes:
- a first pressurization step of supplying the supercritical fluid at the second density to the treatment space to pressurize the treatment space to a preset pressure; and
- a second pressurization step of supplying the supercritical fluid at the first density to the treatment space to pressurize the treatment space to a target pressure.

7. The apparatus of claim 5, wherein the controller is configured to control the fluid supply conduit such that the decompressing step is performed such that:
- the supercritical fluid is supplied to the treatment space during the discharging of the supercritical fluid out of the treatment space; and
- a temperature of the supercritical fluid supplied to the treatment space in the decompressing step is higher than a temperature of the supercritical fluid supplied to the treatment space in the pressurizing step.

8. The apparatus of claim 7, wherein the controller is configured to control the fluid supply conduit such that the decompressing step is performed such that a supply amount per unit time of the supercritical fluid supplied to the treatment space is smaller than a discharged amount per unit time of the supercritical fluid out of the treatment space.

9. The apparatus of claim 7, wherein the controller is configured to control the fluid supply conduit such that a supply amount per unit time of the supercritical fluid supplied to the treatment space in the decompressing step is smaller than a supply amount per unit time of the supercritical fluid supplied to the treatment space in the pressurizing step.

10. The apparatus of claim 7, wherein the controller is configured to control the fluid supply conduit such that the decompressing step includes:
- a first decompressing step of supplying the supercritical fluid at the first density to the treatment space while discharging the supercritical fluid out of the treatment space; and
- a second decompressing step of discharging the supercritical fluid out of the treatment space without supplying the supercritical fluid to the treatment space after the first decompressing step.

11. The apparatus of claim 5, wherein a pattern surface of the substrate faces upwards,
- wherein a lower supply line is connected to a bottom surface of the treatment space to supply the supercritical fluid to the treatment space,
- wherein an upper supply line is connected to a top surface of the treatment space to supply the supercritical fluid to the treatment space, and
- wherein the controller is configured to control the fluid supply conduit such that:
  - in the pressurizing step, the supercritical fluid is supplied to a bottom region of the substrate through the lower supply line; and
  - in the treating step, the supercritical fluid is supplied to a top region of the substrate through the upper supply line.

12. The apparatus of claim 5, wherein the controller is configured to control the fluid supply conduit such that the treating step is performed such that:
- a supply step for supplying the supercritical fluid to the treatment space and an exhaust step for exhausting the supercritical fluid from the treatment space are sequentially repeated a plurality of times; and
- a density of the supercritical fluid supplied to the treatment space in one supply step of the repeated supply steps and a density of the supercritical fluid supplied to the treatment space in another supply step of the repeated supply steps are different from each other.

13. The apparatus of claim 12, wherein the controller is configured to control the fluid supply conduit such that an amount of the supercritical fluid per unit time as supplied to the treatment space in the supply step is smaller than an amount of the supercritical fluid per unit time as supplied to the treatment space in the pressurizing step.

* * * * *